(12) United States Patent
Gao et al.

(10) Patent No.: US 11,737,180 B2
(45) Date of Patent: Aug. 22, 2023

(54) CONTROL CIRCUIT, CHIP AND CONTROL METHOD

(71) Applicant: SHANGHAI BRIGHT POWER SEMICONDUCTOR CO., LTD., Shanghai (CN)

(72) Inventors: Xiaoru Gao, Shanghai (CN); Shungen Sun, Shanghai (CN); Fuqiang Zhang, Shanghai (CN); Xiaohui Cai, Shanghai (CN)

(73) Assignee: SHANGHAI BRIGHT POWER SEMICONDUCTOR CO., LTD., Shanghai (CN)

(*) Notice: Subject to any disclaimer, the term of this patent is extended or adjusted under 35 U.S.C. 154(b) by 0 days.

(21) Appl. No.: 17/331,260

(22) Filed: May 26, 2021

(65) Prior Publication Data
US 2021/0282241 A1 Sep. 9, 2021

Related U.S. Application Data

(63) Continuation of application No. PCT/CN2018/117485, filed on Nov. 26, 2018.

(51) Int. Cl.
*H03K 5/156* (2006.01)
*H05B 45/14* (2020.01)
(Continued)

(52) U.S. Cl.
CPC .............. *H05B 45/14* (2020.01); *H02M 1/08* (2013.01); *H03K 5/1565* (2013.01);
(Continued)

(58) Field of Classification Search
CPC .. H05B 45/14; H05B 45/325; H05B 45/3725; H02M 1/08; H02M 1/0025;
(Continued)

(56) References Cited

U.S. PATENT DOCUMENTS 9,265,104 B2* 2/2016 Szczeszynski ........... H03K 7/08
2008/0298095 A1* 12/2008 Chuang ............. H02M 3/33523
363/21.12
(Continued)

FOREIGN PATENT DOCUMENTS

CN 101917805 A 12/2010
CN 103124460 A 5/2013
(Continued)

*Primary Examiner* — Sibin Chen
(74) *Attorney, Agent, or Firm* — Muncy, Geissler, Olds & Lowe, P.C.

(57) ABSTRACT

A control circuit, a chip and a control method are disclosed. The control circuit includes: an adjustment signal generation unit configured to detect an electrical signal reflecting a power supplied to a load under control of a current value of a reference signal, generate a feedback signal and output an adjustment signal based on both the feedback signal and the reference signal; and a control unit coupled to the adjustment signal generation unit and configured to control the switching circuit on and off based on the adjustment signal. With the generated adjustment signal that reflects a change in an adjustment metric indicated in the reference signal, the control circuit and the driving system can be adapted in real time to the specifications of any AC power standard. Moreover, much more granular adjustments can be made in the power supplied to the load.

19 Claims, 12 Drawing Sheets

(51) Int. Cl.
  *H05B 45/325* (2020.01)
  *H05B 45/3725* (2020.01)
  *H02M 1/08* (2006.01)
  *H02M 7/06* (2006.01)

(52) U.S. Cl.
  CPC ....... *H05B 45/325* (2020.01); *H05B 45/3725* (2020.01); *H02M 7/06* (2013.01)

(58) Field of Classification Search
  CPC ...... H02M 1/0009; H02M 1/007; H02M 1/40; H02M 7/06; H02M 3/156; H03K 5/1565
  See application file for complete search history.

(56) References Cited

U.S. PATENT DOCUMENTS

| | | | | |
|---|---|---|---|---|
| 2012/0299498 | A1* | 11/2012 | Quaal | ............... H05B 45/10 315/210 |
| 2015/0070945 | A1* | 3/2015 | Huang | ............... H02M 1/32 363/21.16 |
| 2019/0181850 | A1* | 6/2019 | Sawano | ......... H03K 17/08122 |

FOREIGN PATENT DOCUMENTS

| | | | |
|---|---|---|---|
| CN | 107172750 | A | 9/2017 |
| CN | 107681888 | A | 2/2018 |
| KR | 20110091292 | A | 8/2011 |
| WO | WO-2016127198 | A1 | 8/2016 |

* cited by examiner

Detect electrical signal reflecting power supply situation of the load under the control of a current value of reference signal — S110

Ouput adjustment signal based on both feedback signal and reference signal — S120

Adjust switch-on period and/or switch-off period of switching circuit based on adjustment signal — S130

CONTROL CIRCUIT, CHIP AND CONTROL METHOD

CROSS-REFERENCES TO RELATED APPLICATION

This application is a continuation of International Patent Application No. PCT/CN2018/117485, filed on Nov. 26, 2018, entitled "CONTROL CIRCUIT, DRIVING SYSTEM, CHIP, CONTROL METHOD AND DRIVING METHOD", and the entire disclosure of which is incorporated herein.

TECHNICAL FIELD

The present application relates to the field of driver circuits and, in particular, to a control circuit, a chip and a control method.

BACKGROUND

A dimming controller can be used in an LED driving system to change brightness of an LED load through adjusting power supplied to the load. Some existing dimming controllers are designed to control an output current by chopping a switching signal using a PWM signal. Since such PWM signals usually operate at 200 Hz to 4 kHz in the audio frequency range, this design would produce hissing sounds. Moreover, as PWM-chopped falling edges may not be synchronized with those of the switching signal, jitter may be introduced into the emanated light. There are also some dimming controllers designed to filter a PWM signal into a DC dimming signal for controlling an output current. Since filtering the PWM signal into a DC dimming signal is in nature analog, this design would be associated with the inherent shortcomings of analog dimming, including the required use of an RC filtering circuit, which will lead to increased cost, as well as limited dimming resolution and accuracy that would not be able to address market needs.

SUMMARY OF THE INVENTION

In view of this, it is an objective of the present application to overcome the above-described problems with conventional power supply designs, such as an insufficient adjustment granularity, by presenting a control circuit, a driving system, a chip, a control method and a driving method.

In order to accomplish the above and other related objectives, in a first aspect of the present application, a control circuit is provided for controlling a switching circuit connected to a load based on an input signal, the input signal being a PWM signal with a duty cycle, the control circuit configured to control the switching circuit on and off based on the duty cycle for adjusting power supplied to the load accordingly, the control circuit including: an adjustment signal generation unit configured to receive a predefined voltage and the input signal, process the predefined voltage based on the input signal, generate a square-wave reference signal reflecting the duty cycle, obtain a feedback signal reflecting the power supplied to the load, and generate an adjustment signal based on both the square-wave reference signal and the feedback signal; and a control unit coupled to the adjustment signal generation unit, configured to generate a control signal for controlling the switching circuit on and off based on the adjustment signal.

Optionally, in the control circuit, the adjustment signal generation unit may include a square-wave reference signal generation module, and the square-wave reference signal generation module including: a chopper configured to receive the input signal and a predefined voltage, and output the square-wave reference signal by chopping the predefined voltage according to the duty cycle.

Optionally, in the control circuit, the adjustment signal generation unit may include a feedback module configured to acquire a sampled electrical signal from the switching circuit and the control signal for generating the feedback signal, the feedback signal reflecting the power supplied to the load within a single operating cycle of the switching circuit.

Optionally, in the control circuit, the feedback module may generate a detecting signal as the feedback signal according to a peak voltage of the sampled electrical signal acquired during an on time of the switching circuit, and wherein the detecting signal reflects an average voltage of the sampled electrical signal within a single operating cycle.

Optionally, in the control circuit, the feedback module may include a sample and hold capacitor, a first switch, a second switch, a proportional amplifier having an operational amplifier and two resistors, wherein during the on time indicated by the control signal, the sample electrical signal charges the sample and hold capacitor through the first switch being on and the second switch being off, wherein during an off time of the switching circuit indicated by the control signal, a voltage across the sample and hold capacitor maintains at the peak voltage of the sample electrical signal within the single operating cycle through the first switch being off and the second switching being on, the voltage across the sample and hold capacitor received and divided by the proportional amplifier, configured to generates the detecting signal at an output of the proportional amplifier, the detecting signal reflecting the an average voltage of the sampled electrical signal in the single operating cycle.

Optionally, in the control circuit, the feedback module may be configured to receive a demagnetization signal of a power conversion circuit connected to the switching circuit, wherein the feedback module includes a second logic processing sub-module and a second signal processing sub-module coupled to the second logic processing sub-module, and wherein: the second logic processing sub-module is configured to control the second signal processing sub-module based on a set of control logics corresponding to multiple time periods within the single operating cycle, the set of control logics based on the control signal of the switching circuit and the demagnetization signal; and wherein the second signal processing sub-module is configured to: output the sampled electrical signal as the feedback signal during the on time indicated by the control signal; output an amplified and buffered sample electrical signal as the feedback signal during a demagnetization period indicated by the demagnetization signal; and output a voltage ground as the feedback signal when the power supplied to the load is zero.

Optionally, in the control circuit, the second signal processing sub-module may include a sample and hold capacitor, a proportional amplifier having an operational amplifier and two resistors, a buffer, the second logic processing sub-module including a first switch, a second switch, a third switch, a fourth switch and an NOR gate, wherein during the on time indicated by the control signal, the control signal turns on the first switch to allow the sampled electrical signal charge the sample and hold capacitor, and the proportional amplifier divides an voltage across the sample and hold capacitor to the buffer, and the control signal turns the third switch on to output the sampled electrical signal as the feedback signal; wherein during the demagnetization period indicated by the demagnetization signal, the control signal turns the first switch and the third switch off, and the demagnetization signal turns the second switch on, and a signal output from the buffer serves as the feedback signal; and wherein when the power supplied to the load is zero, input terminals of the NOR gate receive the control signal and the demagnetization signal, and an output signal of the NOR gate turns the fourth switch on to output a ground voltage as the feedback signal, and the first switch, the second switch, and the third switch are all off.

Optionally, in the control circuit, the feedback module may be configured to receive a demagnetization signal of a power conversion circuit connected to the switching circuit, wherein the feedback module includes a third logic processing sub-module and a third signal processing sub-module coupled to the third logic processing sub-module, and wherein: the third logic processing sub-module is configured to generate a period logic signal based on the demagnetization signal and the control signal of the switching circuit; the third logic processing sub-module is configured to control the third signal processing sub-module based on a set of control logics corresponding to multiple time periods within the single operating cycle, the set of control logics based on the control signal of the switching circuit and the period logic signal; the third signal processing sub-module is configured to output an amplified and buffered sampled electrical signal as the feedback signal during the on time indicated by the control signal and the demagnetization period indicated by the demagnetization signal, and output a voltage ground as the feedback signal when the power supplied to the load is zero.

Optionally, in the control circuit, the third signal processing sub-module may include a loop compensation module, the loop compensation module received the square-wave reference signal and the feedback signal, the loop compensation module configured to perform a low-pass filtering process on an error signal derived from the square-wave reference signal and the feedback signal, and output the adjustment signal.

Optionally, in the control circuit, the adjustment signal generation unit may further include a loop compensation module, the loop compensation module coupled to the reference signal generation module to obtain the reference signal and coupled to the feedback module to obtain the feedback signal, the loop compensation module configured to perform a low-pass filtering process on an error signal derived from the reference signal and the feedback signal, and output the adjustment signal.

Optionally, in the control circuit, the loop compensation module may include: a transconductance amplifier configured to output differential-integral signals derived from the feedback signal and the reference signal; and a filtering capacitor coupled to the transconductance amplifier, the filtering capacitor configured to low-pass filter the differential-integral signals and output the adjustment signal.

Optionally, in the control circuit, the control unit may include: a switching logic module coupled to the adjustment signal generation unit, the switching logic module configured to count down an on time and/or an off time of the switching circuit, based on the adjustment signal and the control signal, and output a logic signal for controlling off and/or on of the switching circuit upon an expiration of a threshold period decided by the adjustment signal; and a logic control module coupled to the switching logic module, the logic control module configured to control off and/or on of the switching circuit based on a control logic of the logic signal for controlling off and/or on of the switching circuit.

Optionally, in the control circuit, the switching logic module may include a switch-on logic module coupled to the adjustment signal generation unit, the switch-on logic module configured to adjust the on time of the switching circuit based on the adjustment signal and output a first logic signal for causing the switching circuit to be switched off upon expiration of a first threshold period decided by the adjustment signal; wherein the switch-on logic module includes: a first timer sub-module configured to acquire the control signal for the switching circuit, start a timer for counting down the on time of the switching circuit when the control signal dictates to switch on the switching circuit, and output timing information indicative of the on time of the switching circuit; and a first logic sub-module coupled to the first timer sub-module, the first logic sub-module configured to output the first logic signal when the timing information is matched with adjustment metric information.

Optionally, in the control circuit, the switching logic module may include a switch-off delay logic module coupled to the adjustment signal generation unit, the switch-off delay logic module configured to adjust a switch-off delay period of the switching circuit based on the adjustment signal and output a second logic signal for enabling the switching circuit being turned on upon an expiration of a second threshold period decided by the adjustment signal; wherein the switch-off delay logic module includes: a segment-wise linear adjustment sub-module with at least two different linear segments, the segment-wise linear adjustment sub-module configured to convert the adjustment signal based on adjustment metric information indicated in the adjustment signal and a corresponding one of the linear segments; and a switch-off delay logic sub-module coupled to the segment-wise linear adjustment sub-module, the switch-off delay logic sub-module configured to acquire the control signal for the switching circuit, start the timer for counting down the off time of the switching circuit based on the control signal and the converted adjustment signal, and output the second logic signal upon the expiration of a second threshold period decided by the adjustment signal.

Optionally, in the control circuit, the segment-wise linear adjustment sub-module may include: at least two linear adjustment sub-modules with different linear profiles, each of the linear adjustment sub-modules configure to convert the adjustment signal based on its own linear profile; and a signal integration sub-module coupled to each of the linear adjustment sub-modules, the signal integration sub-module configured to produce the converted adjustment signal by linearly integrating electrical signals output from the respective linear adjustment sub-modules.

Optionally, in the control circuit, the logic control module may be further configured to receive a demagnetization signal of a power conversion circuit connected to the switching circuit, and the logic control module configured to control on and off of the switching circuit based on a control logic of the logic signal and the demagnetization signal.

In a second aspect of the present application, there is provided a chip including a control circuit for controlling a switching circuit connected to a load based on an input signal, the input signal being a PWM signal with a duty cycle, and the control circuit configured to control an on time and/or an off time of the switching circuit based on the duty cycle for adjusting power supplied to the load, the control circuit including: an adjustment signal generation unit configured to receive a predefined voltage and the input signal, process the predefined voltage based on the input signal, generate a square-wave reference signal reflecting the duty cycle, obtain a feedback signal reflecting the power supplied to the load, and generate and output an adjustment signal based on both the reference signal and the feedback signal; and a control unit coupled to the adjustment signal generation unit, the control unit configured to generate a control signal for controlling the on time and/or the off time of the switching circuit based on the adjustment signal.

In a third aspect of the present application, there is provided a control method for controlling a switching circuit connected to a load based on an input signal, the input signal including a duty cycle, and the control circuit configured to control an on time and/or an off time of the switching circuit based on the duty cycle for adjusting power supplied to the load, the control method including: receiving a predefined voltage and the input signal, processing the predefined voltage based on the input signal, generating a square-wave reference signal reflecting the duty cycle, and, obtaining a feedback signal reflecting the power supplied to the load; generating and outputting an adjustment signal based on both the reference signal and the feedback signal; and generating a control signal for controlling the on time and/or the off time of the switching circuit based on the adjustment signal.

The provided control circuit, driving system, chip, control method and driving method offer the following benefits: with the generated adjustment signal that reflects a change in an adjustment metric indicated in the reference signal, the control circuit and the driving system can be adapted in real time to the specifications of any AC power standard; and through controlling the switch-on and switch-off periods of the switching circuit by means of the adjustment metric information, much more granular adjustments can be made in power supplied to the load.

DETAILED DESCRIPTION

Embodiments of the present application will be described below by means of particular examples. Other advantages and benefits of the present application can be readily appreciated by those familiar with the art from the disclosure herein.

In the following description, reference is made to the accompanying drawings, which illustrate a few embodiments of the present application. It should be understood that other embodiments may also be used and that changes can be made in terms of mechanical composition, structure, electrics and operation without departing from the spirit and scope of the present disclosure. Accordingly, the following detailed description should not be considered to be restrictive, and the scope of embodiments of the present application is only defined by the claims of the published patent. All terms used herein are only intended to describe particular embodiments, rather than limiting the present application in any sense.

Although the terms "first", "second", etc. are used herein in the description of some embodiments to describe various logic signals, these logic signals should not be construed as being limited by the terms. These terms are only intended to distinguish among different logic signals.

Furthermore, as used herein, the singular forms "a", "an" and "the" are intended to include the plural forms as well, unless the context dictates to the contrary. It will be further understood that the terms "comprises" and/or "comprising", when used in this specification, specify the presence of stated features, steps, operations, elements, components and/or groups, but do not preclude the presence or addition of one or more other features, steps, operations, elements, components, and/or groups thereof. As used herein, the terms "or" and "and/or" are to be interpreted as inclusive or meaning any one or any combination. Therefore, "A, B or C" or "A, B and/or C" means "any of the following: A; B; C; A and B; A and C; B and C; A, B and C." An exception to this definition will occur only when a combination of elements, functions, steps or acts are in some way inherently mutually exclusive.

Figure 1:
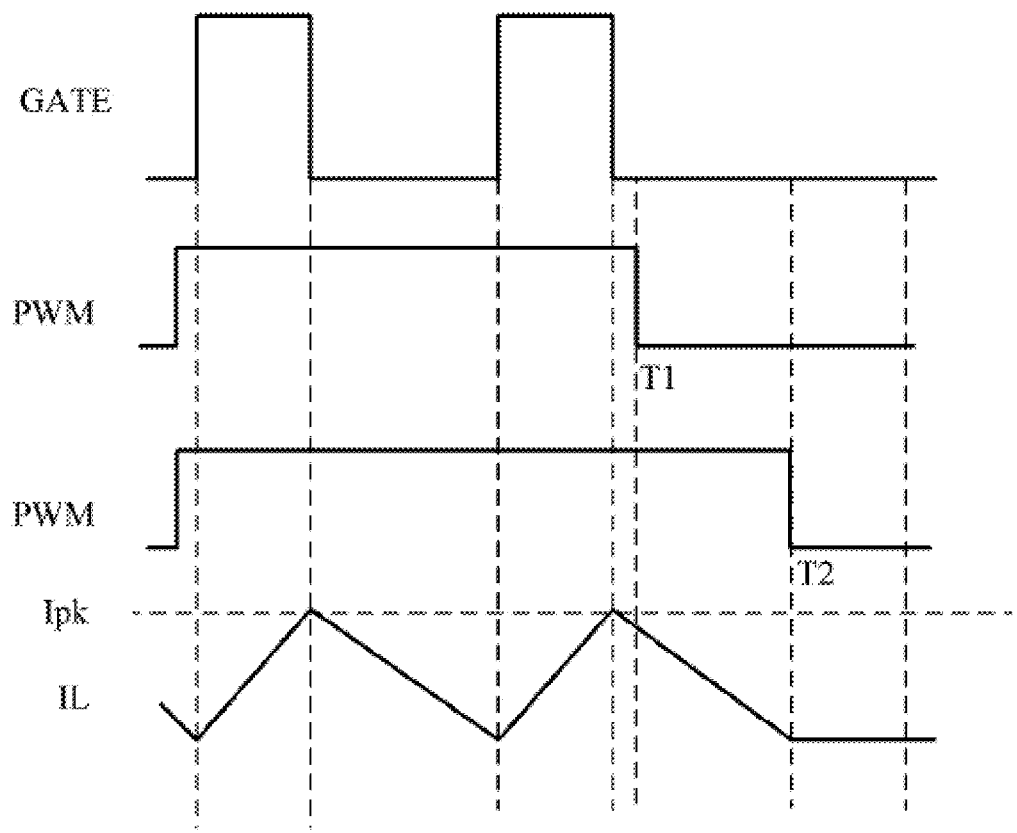
FIG. 1 shows a timing chart for a pulse width modulation (PWM) signal output from a known controller as a control signal and a switching control signal GATE produced by an associated driver circuit.

In some known circuit designs of dimming controllers for LED strip lights, adjustments in brightness of the LED strip lights are accomplished by changing a duty cycle of a control signal. For example, reference is now made to FIG. 1, which shows a timing chart for a pulse width modulation (PWM) signal output from a known controller as a control signal and a switching control signal GATE produced by an associated driver circuit. Here, two waveforms of the PWM signal are shown to exemplify distinct duty cycles of the PWM signal and will not be output from the controller at the same time. Rather, they are only intended to illustrate current profiles in the LED strip light under the control respectively of active periods T1 and T2 of the PWM signal. Generally, the longer active period of the PWM signal will lead to higher brightness of the LED strip light. The switching control signal GATE from the driver circuit is used to control a switching device in the driver circuit, which is configured to control magnetization and demagnetization of an inductor in a power conversion unit. The LED strip light is powered with such magnetization and demagnetization operations of the inductor in the power conversion unit. As can be seen from the figure, the PWM control signal from the controller has a frequency lower than a frequency of the switching control signal GATE. Upon the duty cycle of the PWM signal being changed from T1 to T2, the inductor in the power conversion unit is still in a demagnetized state as the switching device is being switched off. As a result, a current IL flowing through the inductor (i.e., the load current) will drop from a peak Ipk without being affected by the switching device. That is, changing the duty cycle of the PWM signal from T1 to T2 fails to cause an expected change in the inductor current. This is commonly known as a "blind zone" for dimming, where the brightness of the LED strip light does not change with a variation in the PWM duty cycle, leading to a limited dimming resolution of the LED strip light (e.g., 10% or greater).

Similar to dimming controllers, some circuit products for providing a DC power supply using incoming AC power also employ PWM-based control to tune a load's conversion of electrical energy by adjusting a power supplied to the load. For example, a temperature regulator may use a PWM signal to adjust the speed of a fan.

The present application provides a control circuit suitable for use as a dimming controller for an LED light or another DC-power control circuit for controlling a power supply for a load. The control circuit controls an amount of power supplied to a load from a power conversion circuit through controlling switching on and off of a switching circuit. The control circuit controls the switching circuit using an acquired reference signal for adjusting power supplied to the load by changing switch-on and switch-off periods of the switching circuit. The switching circuit and the power conversion circuit may be connected to a power bus so as to constitute an electrical circuit for providing the load with a power supply. The power bus may be part of the power supply circuit, which can output a rectified electrical signal. The switching circuit may include a driving element and a switching element. The driving element may be configured to amplify an output control signal from the control circuit so as to cause the switching element to be switched on or off. The switching element may be implemented as, but is not limited to, any of a power transistor, a bipolar junction transistor (BJT), a junction-gate field-effect transistor (JFET), a depletion MOS power transistor, a thyristor and the like.

Figure 2:
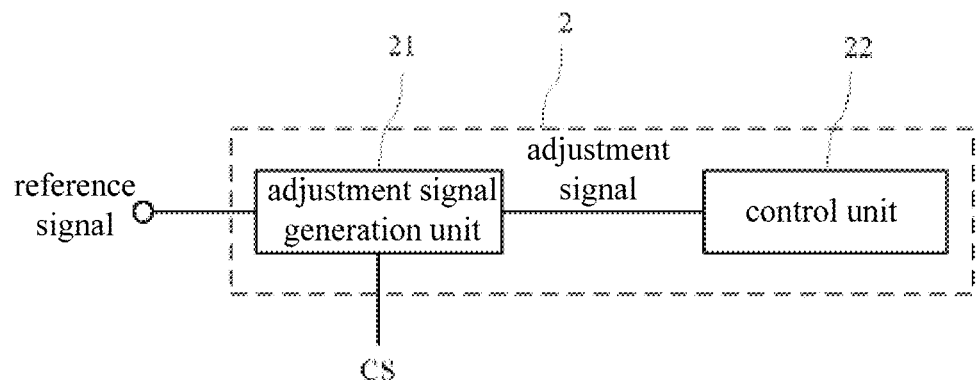
FIG. 2 shows a structural schematic of a control circuit according to an embodiment of the present application.

Reference is now made to FIG. 2, a structural schematic of the control circuit according to an embodiment of present application. The control circuit 2 includes an adjustment signal generation unit 21 and a control unit 22. The adjustment signal generation unit 21 is configured to detect an electrical signal reflecting a power supply situation of the load under the control of a current value of the reference signal, generate a feedback signal, and output an adjustment signal based on both the feedback signal and the reference signal. The electrical signal reflecting the power supply situation of the load may be described with an average voltage, a segment-wise average voltage, a real-time average or the like of power supplied to the load within the switch-on and-off cycle. The reference signal may be a pulse signal with a pulse width adjustable in each pulse cycle and with a duty cycle containing adjustment metric information for power supplied to the load. For example, a duty cycle value of 100% indicates a maximum average current, 0% indicates a minimum average current, and a percentage between 0% and 100% indicates an average current between the maximum and minimum values, for powering the load. There may be a linear or segment-wise linear relationship between the duty cycle and average load current. In this way, the duty cycle of the reference signal contains adjustment metric information for power supplied to the load. The duty cycle of the reference signal may also be considered as an expression of such adjustment metric information.

In some embodiments, the reference signal may be directly provided by a main control circuit. The main control circuit and the control circuit are generally separate circuits, which are connected to each other by an interface circuit. In some examples, the main control circuit may include at least a data interface unit and a processing unit. The data interface unit may include, but is not limited to, a wireless network interface module, a data line interface module, etc. The wireless network interface module may be implemented as, for example, a radio frequency (RF)-based network interface module, a ZigBee-based network interface module, a WiFi-based network interface module, a mobile communication-based network interface module or the like. The data line interface module may be implemented as, for example, a USB-based interface module, an RS-232-based interface module or the like. The processing unit may be connected to both of the wireless network interface module and the data line interface module and configured to convert an adjustment control command acquired by the wireless network interface module into the reference signal and output the reference signal to the control circuit via the data line interface module. For example, the main control circuit may be communicatively coupled to a user's mobile device through the wireless network interface module and acquire the adjustment control command resulting from an operation performed by the user on the mobile device, and the processing unit may convert the adjustment control command into the reference signal, which duty cycle contains adjustment metric information. In other examples, the main control circuit may include a human-machine interaction interface connected to the processing unit via the data interface unit, and the user may manipulate the human-machine interaction interface to result in the adjustment control command. Examples of the human-machine interaction interface may include touch panels, buttons, scroll wheels and the like.

Figure 3:
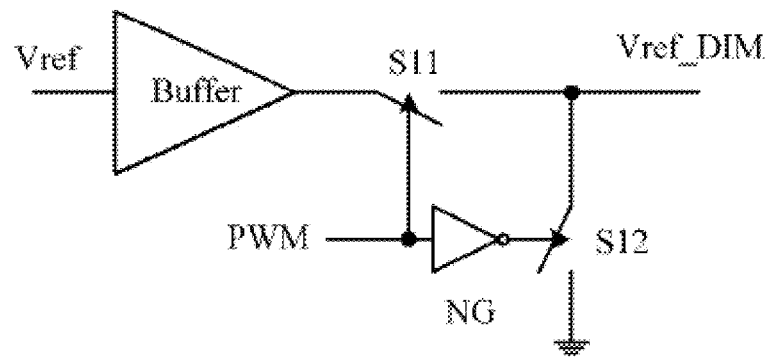
FIG. 3 shows a circuit diagram of a reference signal generation module in a control circuit according to an embodiment of the present application.

In some other embodiments, the reference signal may be generated from a signal with an adjustable pulse width (e.g., a PWM signal) provided by the main control circuit. To this end, the adjustment signal generation unit 21 may include a reference signal generation module 211 configured to output, based on a predefined voltage, the reference signal, which duty cycle is matched with a duty cycle of the acquired PWM signal. The reference signal generation module may be embedded with, or externally connected to, a constant voltage source, from which the predefined voltage Vref is received. In one embodiment, the reference signal generation module may include a buffer Buffer and a chopper circuit. The buffer Buffer may be configured for isolation and to buffer and output the predefined voltage Vref. The chopper circuit may be configured to output, under the control of the PWM signal, the reference signal at a high level equal in magnitude to the voltage Vref or at a low level equal in magnitude to a voltage ground. Reference is now made to FIG. 3, a circuit diagram of the reference signal generation module according to one embodiment. As shown, the chopper circuit may include switches S11, S12 and a NOT gate NG. The NOT gate NG may have an input and an output, which are coupled respectively to control terminals of the switches S11 and S12. The NOT gate NG may receive, from the main control circuit, the PWM signal with an adjustable pulse width for adjusting power supplied to the load. Correspondingly, the reference signal generation module may output, under the control of the chopper circuit, a square-wave signal with a duty cycle matched with that of the PWM signal, as the reference signal Vref_DIM. Here, depending on the structure of the control circuit for adjusting power supplied to the load, the "matching" between the duty cycles of the reference signal and the received PWM signal is intended to mean that the two signals have identical or complementary waveforms. As an example, for the PWM signal with a larger duty cycle, the reference signal output from the adjustment signal generation unit may contain adjustment metric information indicating an increase to be effected in power supplied to the load. As another example, for the PWM signal with a larger duty cycle, the reference signal output from the adjustment signal generation unit may contain adjustment metric information indicating a decrease to be made in power supplied to the load.

In some other embodiments, the adjustment signal generation unit may include a PWM signal generation module configured to generate, based on the acquired control command, the PWM signal, from which the reference signal is generated. The control command may be acquired from a data communication connection between the main control circuit and the control circuit. The data communication connection may be implemented as, but is not limited to, a wireless communication connection or a wired communication connection. For example, the control command may be transmitted in a wireless communication connection between the main control circuit and the control circuit and indicate an adjustment percentage, and the PWM signal generation module may obtain the adjustment percentage by demodulating and decoding the received control command and output the PWM signal with a duty cycle corresponding to the adjustment percentage. Alternatively, the control command may be acquired from an electrical connection between the human-machine interaction interface and the control circuit. For example, with the electrical connection between the human-machine interaction interface and the control circuit, the user may manipulate the human-machine interaction interface to configure pulse width, cycle and other settings of an internal signal generator so that a corresponding analog signal is output, and the PWM signal generation module in the control circuit may receive the analog signal, adjust the duty cycle of the generated PWM signal based on the received analog signal and output the adjusted PWM signal. As practically needed in circuit design, the generated PWM signal as set forth in any of the foregoing embodiments may be either directly used as the reference signal, or provided to the reference signal generation module mentioned in those embodiments, which then generates, from the PWM signal, the reference signal that can be identified within the control circuit.

In order to obtain an adjustment signal better conveying adjustment metric information, the adjustment signal generation unit may detect an electrical signal reflecting a power supply situation of the load under the control of a current value of the reference signal and generate a feedback signal.

Figure 4:
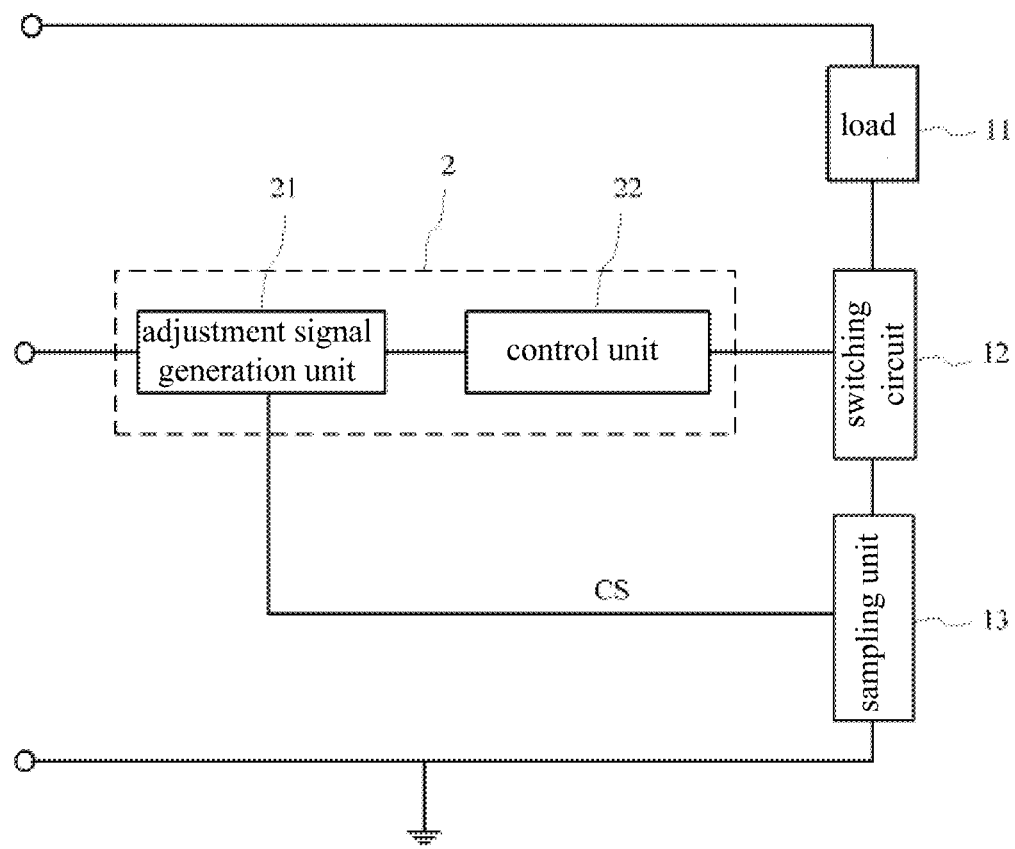
FIG. 4 shows a structural schematic of a control circuit in a driving system according to an embodiment of the present application.

The electrical signal may be sampled from the switching circuit or from a line between the switching circuit and power bus and reflect a change in the power supply situation of the load under the control of a current value of the reference signal, and the adjustment signal generation unit 21 in the control circuit may detect a change in the electrical signal and generate a feedback signal indicative of the change in the electrical signal. The electrical signal may be sampled by a sampling unit arranged in the same line as the switching circuit. Reference is now made to FIG. 4, a structural schematic of the control circuit incorporated in a driving system. As shown, the sampling unit 13 may be arranged between the switching circuit and the ground and configured to output a sampled signal CS. The electrical signal may alternatively be sampled from an internal port of the switching circuit and reflect the power supply situation of the line in which the switching circuit is arranged. For example, the electrical signal may be sampled from a gate or drain of a power transistor in the switching element in the switching circuit 12. The change in the electrical signal may be described with an average voltage, a segment-wise average voltage, a real-time average or the like in the circuit line where the switching circuit is arranged within the switch-on and-off cycle.

Figure 5:
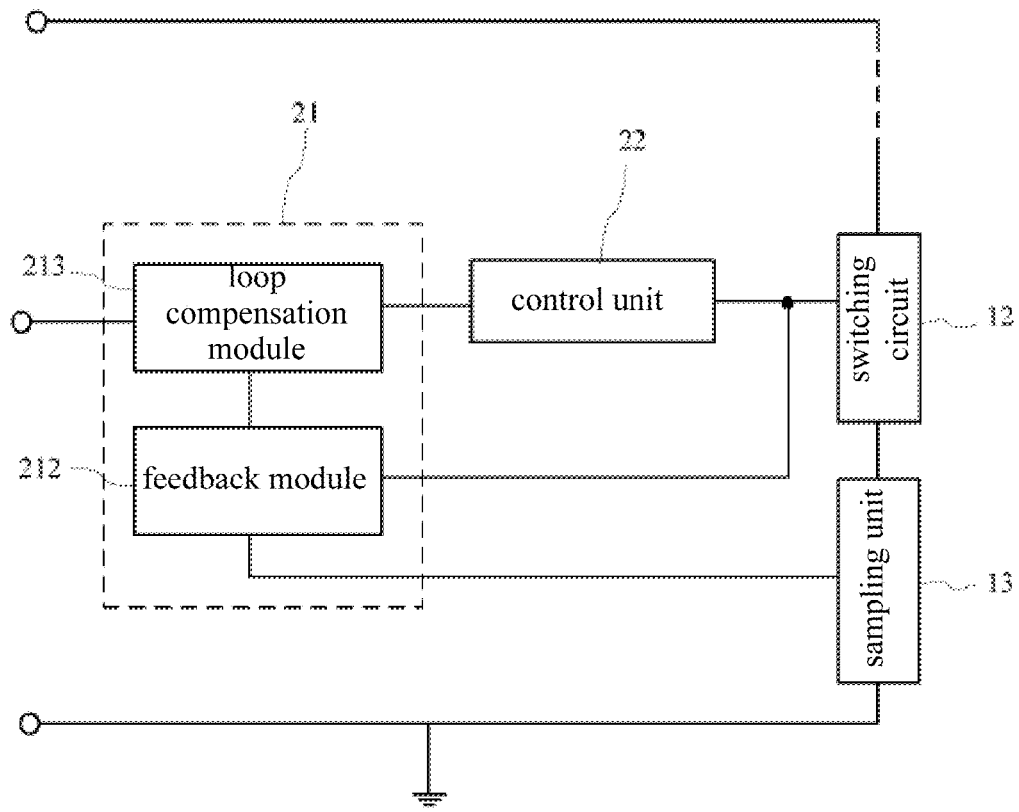
FIG. 5 shows a schematic illustration of the architecture of the adjustment signal generation unit in the control circuit.

To this end, reference is now made to FIG. 5, a schematic illustration of the architecture of the adjustment signal generation unit in the control circuit. As shown, the adjustment signal generation unit 21 may include a feedback module 212 configured to acquire the electrical signal sampled from the switching circuit, detect, based on the sampled electrical signal, a voltage reflecting the power supply situation of the load within a switch-on and-off cycle, and output a corresponding feedback signal. The feedback module may acquire the sampled electrical signal from the sampling unit arranged in the same electrical circuit as the switching circuit. In the example of FIG. 5, the sampling unit 13 is arranged between the switching circuit 12 and the ground and configured to output the sampled electrical signal CS in a switched-on state of the switching circuit 12 and output a low-level signal (e.g., 0 V) in a switched-off state of the switching circuit 12. The feedback module 212 may detect an average voltage of the sampled electrical signal within the switch-on and-off cycle, and the feedback signal CS_pos output therefrom may have an amplitude equal to the average voltage.

In one example, the feedback module is configured to generate, based on the sampled electrical signal acquired in a switched-on state of the switching circuit, the feedback signal, which is a voltage reflecting the power supply situation of the load within the switch-on and-off cycle, and output the feedback signal. Examples of the voltage reflecting the power supply situation of the load within the switch-on and-off cycle may include, but are not limited to, an average voltage, a segment-wise average voltage, a real-time average, etc. in the circuit line where the switching circuit is arranged, within the switch-on and-off cycle.

In some particular examples, an average voltage in the circuit line where the switching circuit is arranged over a switch-on and-off cycle may be proportional to a peak voltage within the specific switch-on and-off cycle, and the feedback module may generate, based on a peak voltage of the sampled electrical signal acquired in a switched-on state of the switching circuit, the feedback signal, which is an electrical signal reflecting the power supply situation of the load within the switch-on and-off cycle, and output the feedback signal.

The feedback module may include a first signal processing sub-module and a first logic processing sub-module. The first signal processing sub-module may be configured to perform a voltage averaging process on the acquired sampled electrical signal and output the feedback signal. The first logic processing sub-module may be coupled to the first signal processing sub-module and configured to be based on a control signal for the switching circuit to cause the signal processing sub-module to output the feedback signal on the basis of the switch-on and-off cycle.

Figure 6:
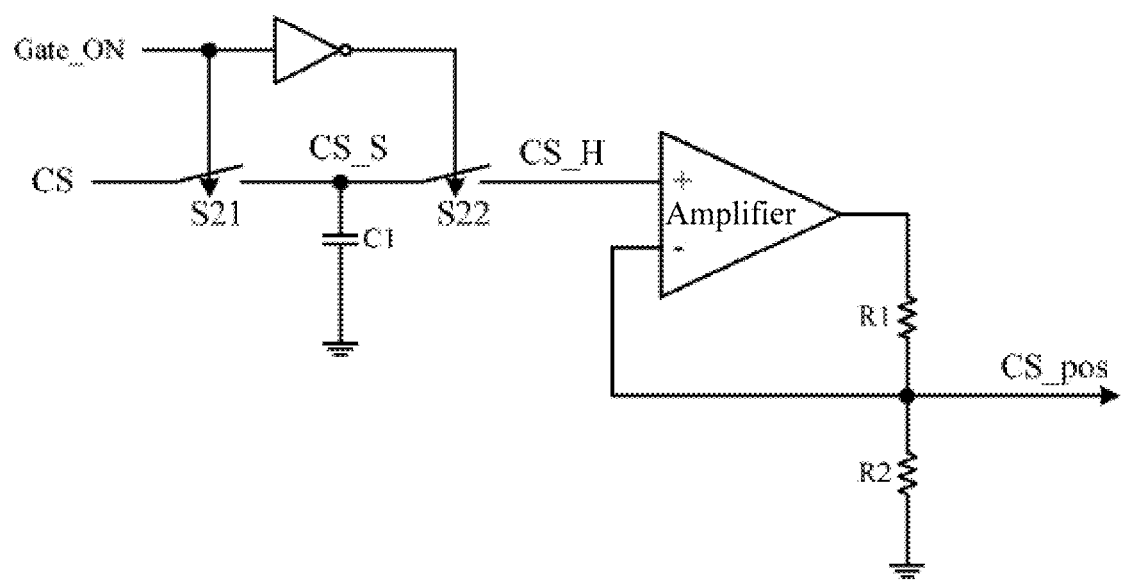
FIG. 6 shows a circuit diagram of a feedback module in a control circuit according to an embodiment of the present application.
Figure 7:
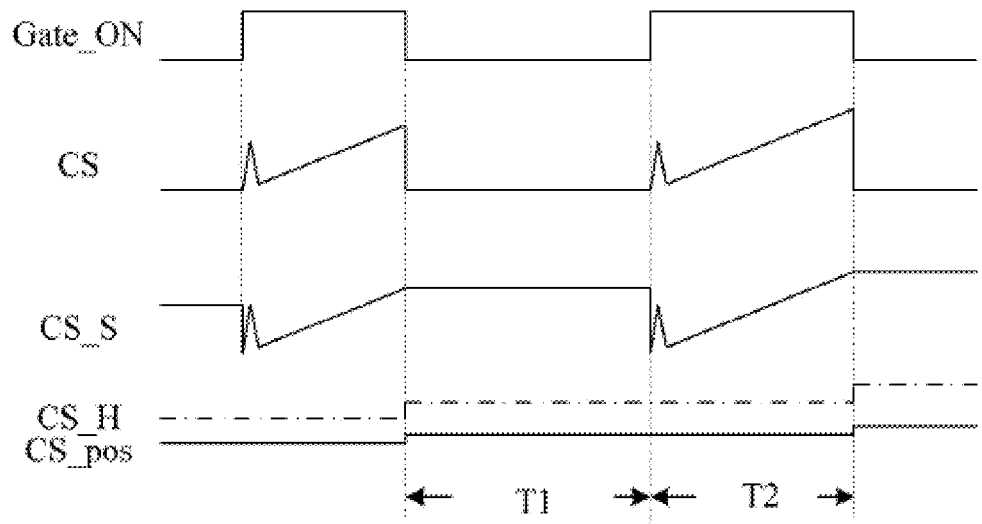
FIG. 7 shows a schematic illustration of labeled signals in FIG. 6.

Reference is now made to FIG. 6, a circuit diagram of the feedback module according to an embodiment, and to FIG. 7, a schematic illustration of signals labeled in FIG. 6. As shown, the first signal processing sub-module may include a capacitor C1, an amplifier and resistors R1 and R2. The first logic processing sub-module may include switches S21 and S22. As shown in FIG. 6, the first logic processing sub-module may receive the control signal GATE_ON output from the control unit to the switching circuit. When GATE_ON is at a high level, the switch S21 is closed, with the switch S22 being opened. As a result, the capacitor C1 is charged by the sampled electrical signal CS. When GATE_ON is at a low level, switch S21 is opened, with the switch S22 being closed. Consequently, the voltage of the electrical signal on a terminal CS_S of the capacitor C1 is fed to a non-inverting input CS_H of the amplifier with a closed-loop gain, processed by the amplifier and output to the resistors R1 and R2, which then divide the voltage of the electrical signal and output the feedback signal CS_pos that corresponds to the resulting average voltage of the electrical signal. Variations of the electrical signal during the operation of the circuit structure of FIG. 6 are shown in FIG. 7. The first signal processing sub-module may obtain a peak voltage of the sampled electrical signal CS at the beginning of a switch-on and-off cycle (T1+T2), and depending on a relationship between the amplifier's gain and the resistances of the resistors R1 and R2, the output feedback signal CS_pos may have a voltage equal to 50% or another fraction of the peak voltage of the sampled electrical signal CS. With this circuit structure, the feedback signal CS_pos output from the feedback module may indicate an average voltage in the circuit line where the switching circuit is arranged within the switch-on and-off cycle (T1+T2).

In another particular example, the power conversion circuit may be included in a driving system for providing a DC power supply, in order to convert rectified power supply waves into more stable DC power supply waves by means of energy conversion enabled by magnetization and demagnetization of an inductor. This operation of the power conversion circuit can be enabled by electric power energy varying in a controlled manner under the action of switching-on and-off of the switching circuit. In order to achieve accurate indication, the control circuit for adjusting power supplied to the load may further include a demagnetization detection unit configured to detect a demagnetization process in the power conversion circuit that is coupled to the switching circuit and output a demagnetization signal. For example, the demagnetization detection unit can be implemented as a demagnetization completion detection module as described in the Publication No. CN107529254A or CN107484305A, all of which are hereby incorporated herein by reference in their entirety. The demagnetization completion detection module may determine the completion of the demagnetization process and generate the demagnetization signal when detecting a voltage valley of the acquired sampled electrical signal. In order to facilitate subsequent logic processing, the demagnetization signal from the demagnetization detection unit may stay active since the switching circuit was switched off, until the completion of the demagnetization process is detected.

For the control circuit for adjusting power supplied to the load, if maximum power being supplied to the load corresponds to a magnetization process being performed in the power conversion circuit in a switched-on state of the switching circuit, with minimum power being supplied to the load corresponding to a demagnetization process being performed in the power conversion circuit in a switched-off state of the switching circuit, then at least one of shortening the switch-on period (i.e., the duration of the magnetization process) and lengthening the switch-off period (i.e., the period after the completion of the demagnetization process) can lead to a reduction in power supplied to the load, i.e., a reduction in the electrical energy converted by the load to another form of energy. In this way, an LED light could be gradually dimmed from the maximum brightness, for example.

Based on both the demagnetization signal and the control signal, the feedback signal generated by the feedback module may more accurately reflect the power supply situation of the load. To this end, the feedback module may be further configured to receive the demagnetization signal and, based upon a control logic of the acquired control signal for the switching circuit and the demagnetization signal, output the feedback signal generated based on the sampled electrical signal acquired in a switched-on state of the switching circuit.

From the control signal and the demagnetization signal, the feedback module may obtain a peak voltage of the sampled electrical signal within a switch-on and-off cycle, a real-time voltage of the sampled electrical signal in a switched-on state of the switching circuit, or the like. Moreover, from the control signal and the demagnetization signal, the feedback module may determine switch-on and switch-off periods of the switching circuit within the switch-on and-off cycle, and even a demagnetization detection period and an interrupted period in the switch-off period. The interrupted period is a time interval when no power is supplied to the load at all.

To this end, the feedback module may include a second signal processing sub-module and a second logic processing sub-module. The second signal processing sub-module may process the voltage of the acquired sampled electrical signal in accordance with the multiple periods of one switch-on and-off cycle and thereby output the feedback signal. The second logic processing sub-module may be coupled to the second signal processing sub-module and configured to control the outputting of the feedback signal from the signal processing sub-module based on a control logic for the multiple periods of one switch-on and-off cycle, which is configured based on the control signal and the demagnetization signal.

With the output feedback signal reflecting the variation of a voltage in the switch-on period of the switching circuit, the demagnetization detection period and the interrupted period within one switch-on and-off cycle as an example, based on the control logic of the acquired demagnetization signal and the control signal for the switching circuit, in the switched-on state of the switching circuit, under the control of the second logic processing sub-module, the second signal processing sub-module may detect the acquired sampled electrical signal in real time and output the real-time voltage as the feedback signal, and further detect a peak voltage of the sampled electrical signal. In the demagnetization detection period, under the control of the second logic processing sub-module, the second signal processing sub-module may process the peak voltage from the second signal processing sub-module and output the processed signal as the feedback signal. In the interrupted period, under the control of the second logic processing sub-module, the second signal processing sub-module may output the voltage ground as the feedback signal. Thus, the feedback signal from the feedback module can more accurately reflect the variation of a voltage in the switching circuit within one switch-on and-off cycle.

Examples of components of the second signal processing sub-module may include, but are not limited to, amplifiers, capacitors, resistors, buffers and the like. Examples of components of the second logic processing sub-module may include, but are not limited to, at least one of AND gates, OR gates, NAND gates, NOT gates, two-piece switches, transistors, power transistors, as well as, encoders, decoders, selectors, for working with those gates to enable the control logic, and the like, and various combinations thereof.

Figure 8:
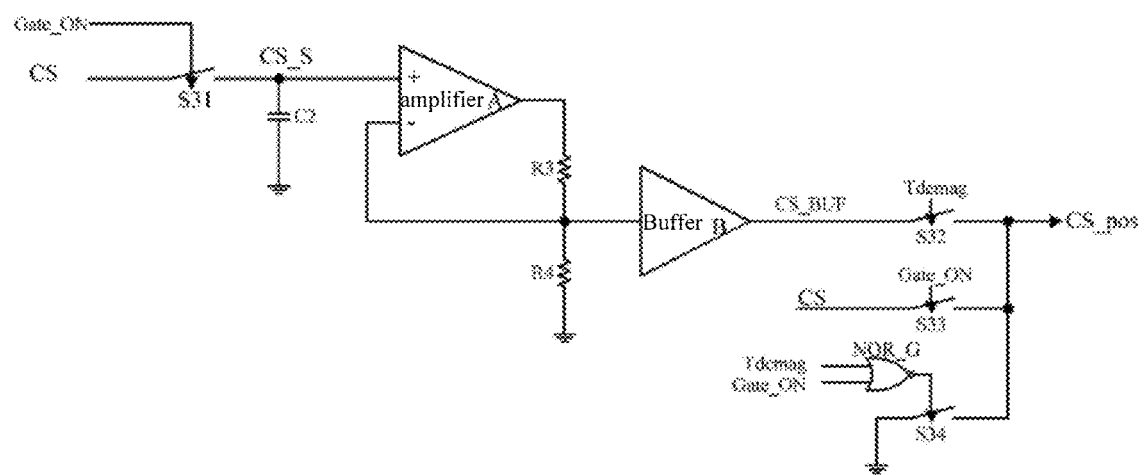
FIG. 8 shows a circuit diagram of a feedback module in a control circuit according to another embodiment of the present application.
Figure 9:
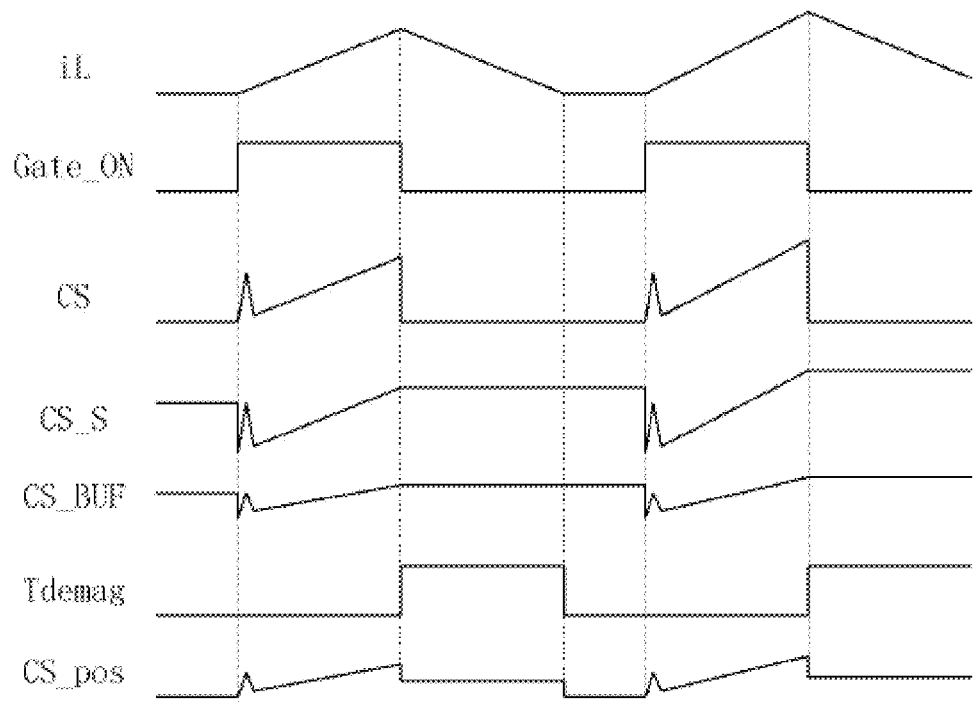
FIG. 9 shows a schematic illustration of labeled signals in FIG. 8.

Reference is now made to FIG. 8, a circuit diagram of the feedback module according to another embodiment, and to FIG. 9, a schematic illustration of signals labeled in FIG. 8. In this embodiment, the second signal processing sub-module includes, among others, a capacitor C2, an amplifier A, resistors R3 and R4 and a buffer B. The second logic processing sub-module includes switches S31, S32, S33, S34 and a NOR gate NOR_G.

With combined reference to FIGS. 8 and 9, the switching circuit is switched on at a high level of the control signal GATE_ON and off at a low level of the control signal GATE_ON. The demagnetization signal Tdemag stays active (i.e., high) since a transition of the signal GATE_ON to the low level and is deactivated (i.e., low) upon the demagnetization detection unit detecting the completion of the demagnetization process. According to the above-described control logic, the switches S31 and S33 operate under the control of the control signal GATE_ON, the switch S32 under the demagnetization signal Tdemag and the switch S34 under the NOR gate NOR_G. The NOR gate NOR_G controls the switch S34 based on the control signal GATE_ON and the demagnetization signal Tdemag. When the control signal is high (i.e., the switching circuit is being switched on) with the demagnetization signal being low (i.e., detection of the demagnetization process has not been started yet), the switches S31 and S33 are switched on, with the switches S32, S34 being switched off. As a result, the feedback signal CS_pos output from the second signal processing sub-module is the acquired sampled electrical signal CS. At the same time, due to energy storage of the capacitor C2, a voltage at a terminal CS_S thereof varies with that of the sampled electrical signal CS, and the voltage of the sampled electrical signal CS is divided by the amplifier A and the resistors R3, R4, resulting a signal CS_BUF output from the buffer B. When the control signal is low (i.e., the switching circuit is being switched off), with the demagnetization signal being high (i.e., during the detection of the demagnetization process), the switches S31, S33, S34 are switched off, with the switch S32 being switched on. As a result, the feedback signal CS_pos output from the second signal processing sub-module is the signal CS_BUF from the buffer B, which has a voltage as a result of dividing the voltage of the sampled electrical signal CS at the end of the switch-on period of the switching circuit and in relation to an impedance ratio of the voltage of the sampled electrical signal CS and the resistors R3, R4. When the control signal is low (i.e., the switching circuit is being switched off), with the demagnetization signal also being low (i.e., detection of the demagnetization process has not been started yet), the switch S31, S32, S33 are switched off, with the switch S34 being switched on. As a result, the feedback signal CS_pos from the second signal processing sub-module is the voltage ground.

Figure 10:
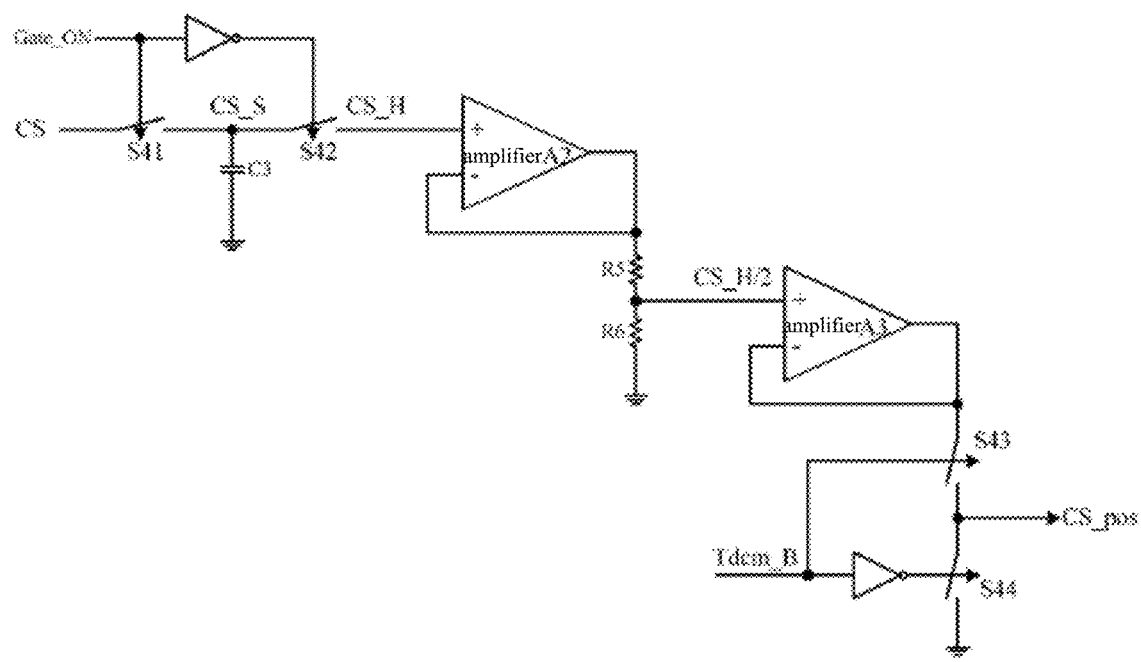
FIG. 10 shows a circuit diagram of a feedback module in a control circuit according to yet another embodiment of the present application.
Figure 11:
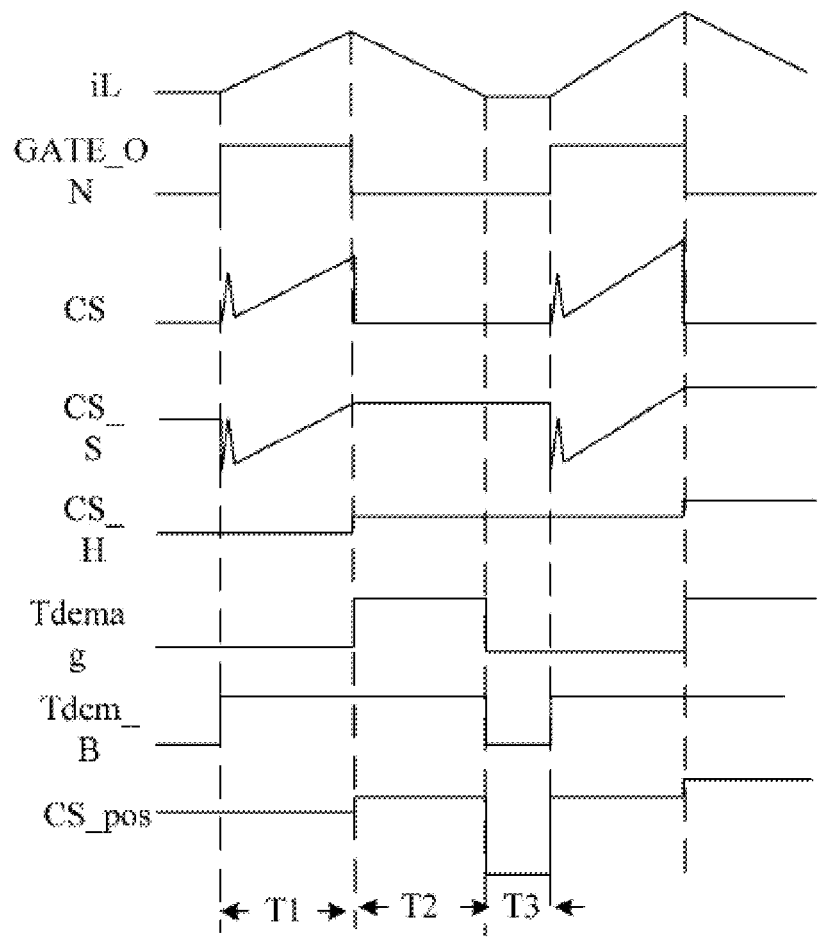
FIG. 11 shows a schematic illustration of labeled signals in FIG. 10.

Reference is now made to FIG. 10, a circuit diagram of the feedback module according to a further embodiment, and to FIG. 11, a schematic illustration of signals labeled in FIG. 10. In this embodiment, the second signal processing sub-module includes a capacitor C3, amplifiers A2 and A3 and resistors R5 and R6. The second logic processing sub-module includes switches S41, S42, S43, S44 and is configured to generate a logic signal Tdcm_B based upon the demagnetization signal Tdemag and the control signal GATE_ON. Different levels of the logic signal Tdcm_B indicate whether it is in an interrupted period of a switch-on and-off cycle. For example, as shown in FIG. 11, a high level of the logic signal Tdcm_B may indicate that it is not in an interrupted period, while a low level thereof may indicate that it is now in an interrupted period T3. The interrupted period is a time interval when the load current iL is zero.

In the control logic of the control signal GATE_ON and the logic signal Tdcm_B as shown in FIGS. 10 and 11, when both GATE_ON and the logic signal Tdcm_B are at respective high levels, i.e., in the switch-on period T1 of the switching circuit, the switches S41 and S43 are switched on, while the switches S42 and S44 are switched off. As a result, the feedback signal CS_pos output from the second signal processing sub-module is an average voltage determined based on the start time of the switch-on period of the switching circuit. When GATE_ON is at a low level, with the logic signal Tdcm_B still being at the high level, i.e., in a demagnetization detection period T2, the switches S42 and S43 are switched on, while the switches S41 and S44 are switched off. As a result, the feedback signal CS_pos output from the second signal processing sub-module is an average voltage determined based on the start time of the demagnetization detection period. When both GATE_ON and the logic signal Tdcm_B are at the respective low levels, i.e., in an interrupted period T3, the switches S42 and S44 are switched on, while the switches S41 and S43 are switched off. As a result, the feedback signal CS_pos output from the second signal processing sub-module is the voltage ground.

It is to be noted that what are shown in FIGS. 6, 8 and 10 are merely examples of the circuit structure of the feedback module, which do not imply any limitation thereon. In practice, the above-described control logic can be implemented by any of other various possible circuit structures based on the logic information of the control signal and the demagnetization signal, which are not detailed herein to avoid obscuring the present application.

The adjustment signal generation unit is configured to output an adjustment signal based on both the feedback signal as set forth in any of the foregoing embodiments and the received reference signal. The adjustment signal may be a signal with a voltage indicative of the duty cycle of the reference signal, or of the difference between an adjustment metric value M1 indicated in the reference signal and an adjustment metric value M2 for the load. An increase in the voltage of the adjustment signal may indicate that the control unit in the control circuit is needed to cause, by controlling the switching circuit, an increase in the power supply current for the load, which corresponds to the metric value indicated by the voltage of the adjustment signal. For example, when the load is an LED light, the voltage of the adjustment signal may contain metric information dictating an adjustment to be made in brightness of the LED light. In this case, in response to an increase of the voltage of the adjustment signal from v1 to v2, the control unit may cause the switch-on period of the switching circuit to extend from t1 to t1', or cause the switch-off period of the switching circuit to be shortened from t2 to t2', so that the value of a metric measuring the adjustment brightness of the LED light (e.g., light intensity) corresponds to the voltage value v2.

In order to be able to output the adjustment signal, as shown in FIG. 5, the adjustment signal generation unit 21 may include a loop compensation module 213 coupled to the feedback module 212 and configured to acquire the reference signal, perform a low-pass filtering process on an error signal produced derived from the reference signal and the feedback signal, and output the adjustment signal corresponding thereto. The error signal may indicate a change in the reference signal.

The loop compensation module 213 may perform differential-integral processes with the reference signal as a reference signal and with the voltage of the feedback signal as an input voltage, and the adjustment signal may be output from the differential-integral process. The feedback signal may reflect a power supply situation of the load under the action of adjustment metric information indicated in a current value of the reference signal. When the change in the reference signal lasts for a time period Δt, the voltage of the adjustment signal resulting from the low-pass filtering process performed by the loop compensation module 213 on the error between the reference signal and the feedback signal may indicate a variation in the adjustment metric within the time period Δt. The time period Δt may be at least equal to a time period required by the feedback module to process the sampled electrical signal, or a unit time interval configured internally in the loop compensation module for the performance of the differential-integral process. For example, assuming the feedback module detects that the load is currently powered with an average voltage v1, a duty cycle P1 of the reference signal and a voltage V1 of the adjustment signal, if the duty cycle of the reference signal is not adjusted within the time period Δt, then the voltage of the adjustment will vary around the average voltage v1 within a stable range. If the duty cycle P1 of the reference signal is decreased (or increased) from P1 to P2, meaning that the average power supply voltage for the load is to be lowered (or raised) from v1' to v2', then the loop compensation module will pull the voltage of the adjustment signal from V1 up (or down) to V2 within the time period Δt by means of differential-integral processing, followed by corresponding adjustments made in the switch-on and switch-off periods of the switching circuit by the control unit based on the changed voltage of the adjustment signal. In this way, a drop (or rise) of the average power supply voltage for the load from v1' to v2' can be enabled.

Figure 12:
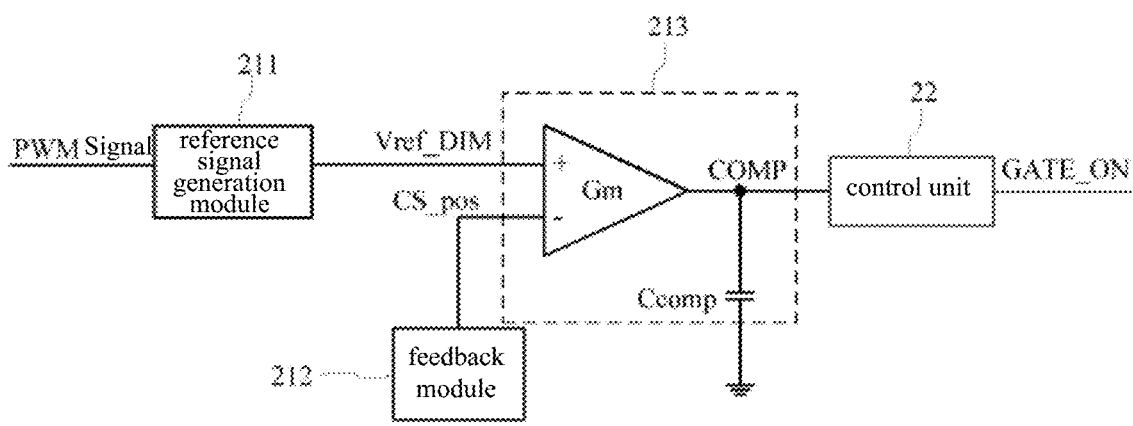
FIG. 12 shows a structural schematic of a control circuit according to an embodiment of the present application.

Reference is now made to FIG. 12, a structural schematic of the control circuit according to some embodiments. In such embodiments, the loop compensation module 213 may include a transconductance amplifier Gm and a filtering capacitor Ccomp. The transconductance amplifier Gm may have a non-inverting input for receiving the reference signal Vref_DIM, an inverting input for receiving the feedback signal CS_pos, and an output coupled to the filtering capacitor Ccomp. The transconductance amplifier Gm and the filtering capacitor Ccomp may make up a low-pass filter, from which the adjustment signal COMP is output. The voltage of the adjustment signal COMP may vary with the duty cycle of the reference signal Vref_DIM.

In some other embodiments, the loop compensation module may be adapted to perform digital differential-integral processes between the feedback signal and the reference signal to generate differential-integral signals, and to accumulate a count of the differential-integral signals to convert them to an analog signal as the adjustment signal.

The loop compensation module may perform the digital differential-integral processes on the feedback signal on the basis of a unit interval derived from a clock signal, with the currently detected voltage of the reference signal as a reference voltage, and the resulting differential-integral signals may be digital adjustment signals in the form of high/low levels, which vary with the reference signal on the basis of the unit interval. The unit interval may span one or N cycles of the clock signal, where N>1. In order to be compatible with upstream and downstream circuit components, the output signal from the loop compensation module must be an electrical signal that can be processed by the analog electronic components. To this end, the loop compensation module may accumulate a count of the digital adjustment signals from the differential-integral processes to obtain the adjustment signal that varies in voltage in cycles occurring on the basis of the unit interval. The adjustment signal is an electrical signal reflecting the error between the reference signal and the feedback signal that has experienced low-pass filtering. Depending on the practical circuit design requirements, a frequency of the clock signal, some internal reference voltages (e.g., voltage steps, voltage amplitudes) and analog and digital components may be selected for the loop compensation module based on the circuit's resolution.

Figure 13:
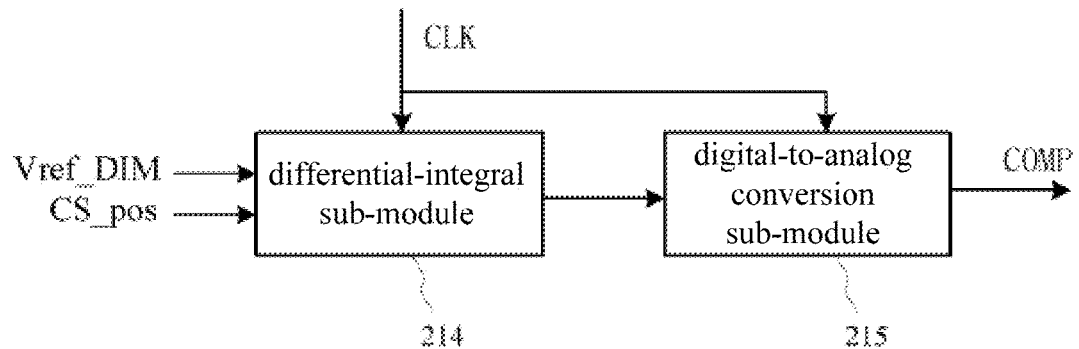
FIG. 13 shows a structural schematic of a loop compensation module in a control circuit according to an embodiment of the present application.

For example, reference is now made to FIG. 13, a structural schematic of the loop compensation module according to another embodiment. As shown, the loop compensation module may include a differential-integral sub-module 214 and a digital-to-analog conversion sub-module 215, which operate under the control of pulse signals CLK occurring on the basis of the unit interval.

The differential-integral sub-module 214 may be configured to perform fully differential-integral processes between the feedback signal CS_pos and the reference signal Vref_DIM based on differential-integral signals fed back on the basis of the unit interval, and to output 1-bit differential-integral signals (each of which presents one digital bit). The unit interval may be configured based on an integer number of cycles of an internal clock signal.

With the unit interval as Δt, the differential-integral sub-module 214 may be configured, in accordance with a differential-integral process between $(V_{CS} \pm V_{FS})$ and the voltage $V_{ref\_DIM}$ of the reference signal Vref_DIM, with a circuit structure for performing a differential process selectively between the voltage of the feedback signal CS_pos and a predefined voltage step, or between the voltage of the reference signal Vref_DIM and the voltage step, depending on a differential-integral signal from the previous unit interval, and with another circuit structure for performing an integral process between two signals from the differential process and thus obtaining a 1-bit digital differential-integral signal, which is described by a high/low level and is output for the current unit interval. Here, $V_{CS}$ denotes the voltage of the feedback signal CS_pos, and $V_{FS}$ represents the voltage step, which may be provided either by an internal reference voltage, or by the high voltage level of the differential-integral signal.

The digital-to-analog conversion sub-module 215 may accumulate the differential-integral signals on the basis of the unit interval and thereby convert them into the analog filtered signal.

The digital-to-analog conversion sub-module 215 may include an additive-subtractive counter and a digital-to-analog converter. The additive-subtractive counter may receive the 1-bit differential-integral signals and accumulate a count thereof. The additive-subtractive counter may produce M-bit outputs. During each counting process, the additive-subtractive counter may sample a differential-integral signal on the basis of the unit interval. If the sampled differential-integral signal is at a high level, the additive-subtractive counter may perform an additive operation. If the sampled differential-integral signal is at a low level, the additive-subtractive counter may perform a subtractive operation. Each additive or subtractive operation may lead to an update of the count, which is output as an M-bit binary digital signal to the digital-to-analog converter. The digital-to-analog converter may produce a voltage signal from such received M-bit binary digital signals, as the adjustment signal COMP.

The adjustment signal is output to the control unit, which then adjusts only the switch-on period, or only the switch-off period, or both these periods of the switching circuit based on the adjustment signal.

Figure 14:
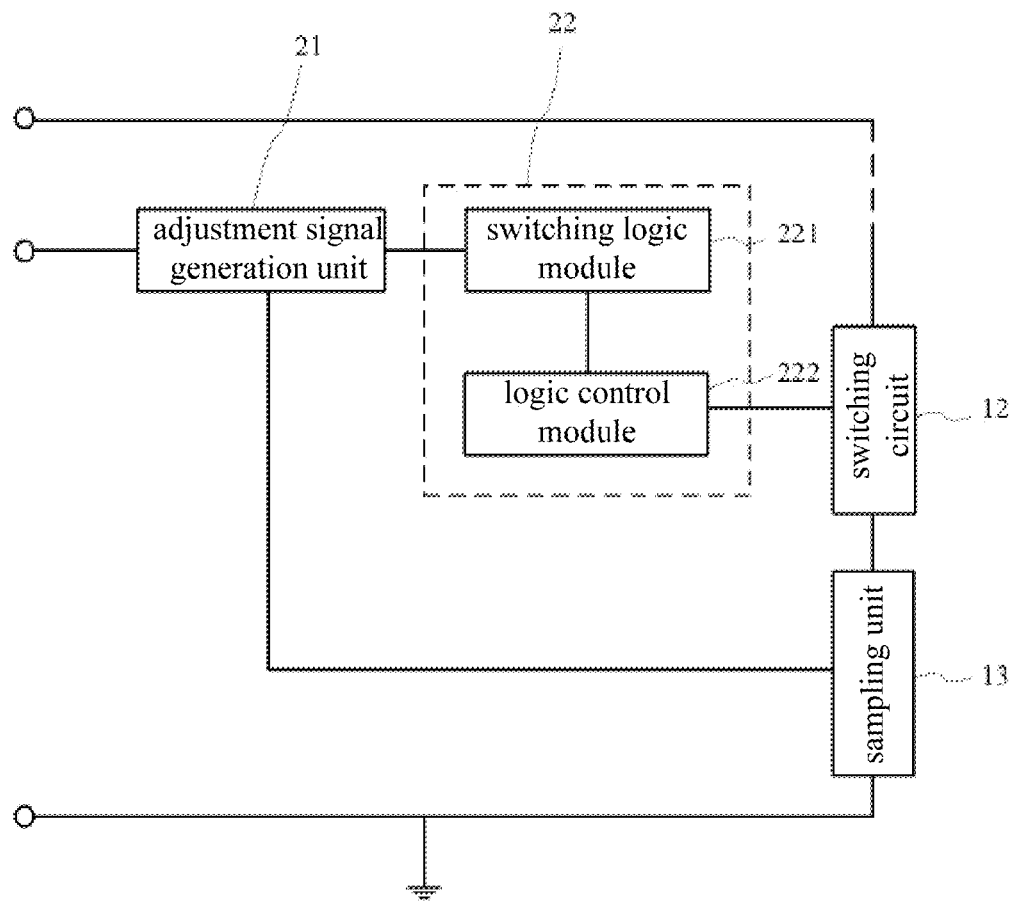
FIG. 14 shows a structural schematic of a control unit in a control circuit according to an embodiment of the present application.

In order to enable adjusting the switch-on period and/or switch-off period of the switching circuit, referring to FIG. 14, a structural schematic of the control circuit according to an embodiment, the control unit 22 may include a switching logic module 221 and a logic control module 222.

The switching logic module 221 may be coupled to the adjustment signal generation unit 21 and configured to start a timer for counting down the switch-on period and/or switch-off period of the switching circuit, based on the adjustment signal and the control signal for the switching circuit, and upon expiry of the timer, output a logic signal for causing switching off and/or on of the switching circuit. When counting down the switch-on period, the switching logic module may maintain a logic signal that keeps the control circuit in a switched-on state until the expiry of the timer when it outputs the logic signal for causing the switching circuit to be switched off. When counting down the switch-off period, the switching logic module may maintain a logic signal that keeps the control circuit in a switched-off state until the expiry of the timer when it outputs the logic signal for causing the switching circuit to be switched on. The switch-off period may be determined based on the demagnetization detection period, or on the demagnetization detection period or a switch-off delay period, whichever is longer. Depending on the voltage of the adjustment signal, the switch-off delay period may be adjustable up to a maximum that may be either longer or shorter than the demagnetization detection period.

The switching logic module 221 may include a switch-on logic module coupled to the adjustment signal generation unit and configured to adjust the switch-on period of the switching circuit based on the adjustment signal and output a first logic signal for causing the switching circuit to be switched off when the switch-on period has expired.

With a voltage indicated in the adjustment metric information as a threshold voltage, the switch-on logic module may start a timer for counting down the switch-on period upon the switching circuit being switched on and output the first logic signal when the switch-on period expires. The switch-on logic module may include a first timer sub-module and a first logic sub-module. When capturing the control signal for the switching circuit, the first timer sub-module may be configured to start counting down the switch-on period of the switching circuit if the control signal dictates so and output timing information indicative of the switch-on period of the switching circuit. Examples of the control signal may include, but are not limited to, a control signal output from the control circuit to the switching circuit and a driving signal output from the driving element in the switching circuit to the switching element therein. The timing information may be indicated in a voltage. To this end, the switch-on logic module may include a component that can vary linearly over time and is configured to output a voltage signal indicating a value of the timer.

Figure 15:
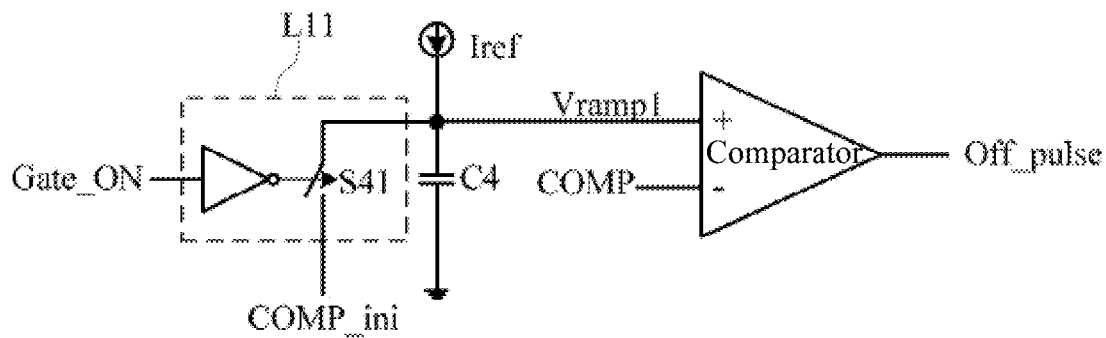
FIG. 15 shows a circuit diagram of a switch-on logic module in a control circuit according to an embodiment of the present application.

In one example, referring to FIG. 15, a circuit diagram of the switch-on logic module according to an embodiment, the first timer sub-module may include a set of logic elements L11 and a capacitor C4. The set of logic elements L11 may be configured to acquire the control signal for the switching circuit. The set of logic elements L11 may be configured on the basis of a control logic of the control signal for charging and discharging the capacitor C4. Under the control of the set of logic elements, the capacitor C4 may start being charged when the switching circuit is switched on and start being discharged when the switching circuit is switched off. In the example of FIG. 15, the set of logic elements L11 may include a NOT gate and a switch S41, and the first timer sub-module may be embedded with, or externally connected to, a current source for supplying a charging current Iref to the capacitor C4. The first timer sub-module may be additionally embedded with, or externally connected to, a voltage source for providing the capacitor C4 with a discharge path when it is discharged under the control of the set of logic elements L11 as well as with an initial voltage COMP_ini. Examples of the cut-off device may include backward diodes and resistors. When the control signal for the switching circuit dictates to switch on the switching circuit (i.e., when acquiring a switch-on signal for the switching circuit), the switch S41 may be switched off, allowing the current source to charge the capacitor C4. As a result, a voltage at a terminal of the capacitor C4 will be raised and output to the first logic sub-module. When the control signal for the switching circuit dictates to switch off the switching circuit (i.e., when acquiring a switch-off signal for the switching circuit), the switch S41 may be switched on, allowing the current source to discharge the capacitor C4 to the initial voltage COMP_ini.

It is to be noted that the first timer sub-module shown in FIG. 15 is merely exemplary, and should not be construed to limit the scope of the present application in any sense. The capacitor C3 may also be charged with the high level of the control signal and discharged by using another set of logic elements to cause a line connecting the capacitor C3 to the voltage ground to be switched on and off. Although not detailed herein, there are still many other possible alternative approaches.

In another example, the first timer sub-module may receive a clock signal and include a counter D1 and a set of logic elements L2 operating under the control of the control signal for the switching circuit. When the control signal dictates to switch on the switching circuit (i.e., when acquiring a switch-on signal for the switching circuit), the counter D1 may count the number of cycles of the clock signal and output a voltage indicating the count of cycles. When the control signal for the switching circuit dictates to switch off the switching circuit (i.e., when acquiring a switch-off signal for the switching circuit), the counter D1 may be reset. The set L2 may include logic elements such as flip-flops.

The first timer sub-module may output the timing information in the form of a voltage to the first logic sub-module, which may be configured to output the first logic signal when determining that the timing information is matched with the adjustment metric information. In particular, with the voltage of the adjustment signal COMP from the aforementioned adjustment signal generation unit as a threshold voltage, the first logic sub-module may compare the voltage Vramp1 from the first timer sub-module with the threshold voltage using a comparator. When the voltage Vramp1 reaches the threshold voltage, it may output the first logic signal Off_pulse. As shown in FIG. 15, the comparator may have a non-inverting input for receiving the voltage Vramp1 and an inverting input for receiving the voltage of the adjustment signal COMP. When the voltage Vramp1 rises to the voltage of the adjustment signal COMP, it may output the first logic signal Off_pulse as a high level. It should be noted that, as will be appreciated by those of ordinary skill in the art, whether the first logic signal Off_pulse is active at a high level or at a low level may depend on the subsequent control logic, and the first logic sub-module shown in FIG. 15 is merely exemplary, and should not be construed to limit the scope of the present application in any sense. The first logic signal may be output to the logic control module, which may then execute a switch-off control logic based on the first logic signal and thereby output a control signal for causing the switching circuit to be switched off. The control logic of the logic control module may also be related to a switch-off delay logic module.

The switch-off delay logic module may be included in the switching logic module and coupled to the adjustment signal generation unit. It may be configured to adjust the switch-off delay period for the switching circuit based on the adjustment signal and output a second logic signal for causing the switching circuit to be switched on when the switch-off delay period expires.

In particular, with the voltage of the adjustment signal as a threshold voltage, the switch-off delay logic module may start a timer for counting down the switch-off delay period upon the switching circuit being switched off, and output the second logic signal upon the expiry of the switch-off delay period. In some examples, the switch-off delay logic module may have a circuit structure that is identical or similar to that of the switch-on logic module, and a repeated description thereof can be thus dispensed with.

In some other embodiments, the switch-off delay logic module may adjust the switch-off delay period for the switching circuit based on the adjustment signal in a segment-wise linear manner, in order to achieve an increased adjustment granularity in segments of a power supply range for the load that are around the upper and lower bounds. The switch-off delay period may be equal to the switch-off period of the switching circuit or a fraction thereof. The switch-off delay logic module may include at least one semiconductor device or set of semiconductor devices, which can adjust a voltage based on the adjustment signal. In this case, the switch-off delay period can be adjusted by taking the advantage of a characteristic of the semiconductor device or set of semiconductor devices that varies linearly with the voltage within a range and optionally becomes saturated within another range. For example, in the case that an increase in the voltage of the adjustment signal will lead to a corresponding reduction in the switch-off delay period, when the voltage of the adjustment signal falls within the linear range of the semiconductor device(s) in the switch-off delay logic module, the semiconductor device(s) may convert the voltage of the adjustment signal into a threshold voltage, and a timing component in the switch-off delay logic module, such as a capacitor (or clock signal counter), which utilizes a voltage to indicate timing information, may keep a timer for the switch-off delay period and output the second logic signal when the time expires.

In order to enable segment-wise linear adjustments based on the adjustment signal, the switch-off delay logic module may include a segment-wise linear adjustment sub-module and a switch-off delay logic sub-module.

The segment-wise linear adjustment sub-module may have at least two different linear segments and be configured to receive the adjustment signal and convert it based on the adjustment metric information indicated in the adjustment signal and a corresponding one of the linear segment to the adjustment metric information.

Based on an adjustment metric range corresponding to the voltage of the adjustment signal (e.g., a voltage range of the adjustment signal), a technician may choose a semiconductor device or a set of semiconductor devices in the switch-off delay logic module, with a voltage profile divided into a linear section and a constant section within the adjustment metric range. With this arrangement, the switch-off delay period may be adjusted based on a desired amount of power supplied to the load. In another particular example, the switch-off delay logic module may include multiple semiconductor devices or sets of semiconductor devices having individual linear ranges with respective weights. In this case, in the adjustment metric range corresponding to the adjusting voltage (e.g., the voltage range of the adjustment signal), the switch-off delay period may be adjusted in a segment-wise linear manner with the weights of the individual semiconductor device or sets of semiconductor devices in the respective ranges. In another particular example, the switch-off delay logic module may employ a combination of these two examples to achieve segment-wise adjustment of the switch-off delay period using multiple semiconductor devices or sets of semiconductor devices having individual linear ranges with respective weights and individual saturation ranges.

Figure 16:
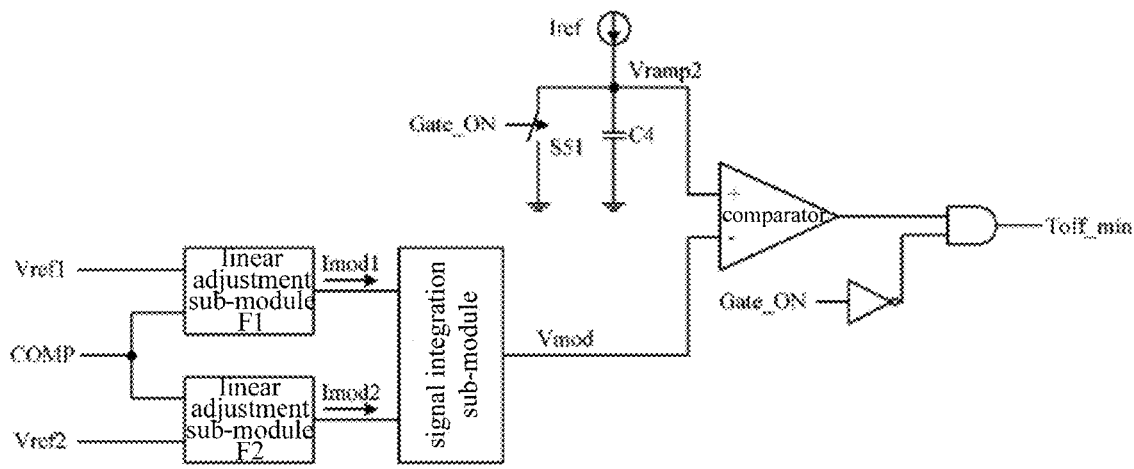
FIG. 16 shows a structural schematic of a switch-off delay logic module in a control circuit according to an embodiment of the present application.
Figure 17:
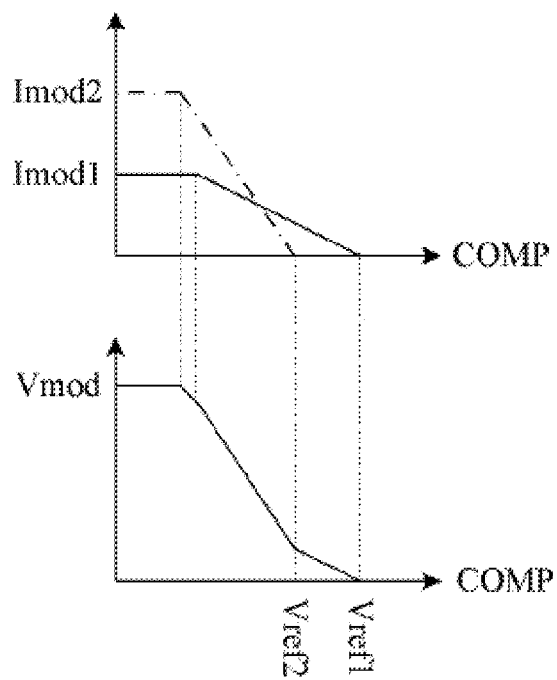
FIG. 17 shows waveforms of electrical signals in FIG. 16.

Reference is now made to FIG. 16, a structural schematic of the switch-off delay logic module according to an embodiment, and to FIG. 17, a diagram of waveforms of electrical signals shown in FIG. 16. The segment-wise linear adjustment sub-module may include at least two linear adjustment sub-modules having different linear profiles. Each of the linear adjustment sub-modules may be based on its own linear profile to convert the received adjustment signal. The different linear profiles may include, but are not limited to, at least one of different saturation voltages of the linear adjustment sub-modules and different linear voltage coefficients of the linear adjustment sub-modules. As shown in FIG. 16, the segment-wise linear adjustment sub-module may include a linear adjustment sub-module F1 and another linear adjustment sub-module F2. As shown in FIG. 17, the linear adjustment sub-module F1 may have a linear voltage range bounded by a reference voltage Vref1 at one end and by a saturation voltage of a semiconductor device or a set of semiconductor devices in the linear adjustment sub-module F1 at the other end. The linear adjustment sub-module F2 may have a linear voltage range bounded by a reference voltage Vref2 at one end and by a saturation voltage of a semiconductor device or a set of semiconductor devices in the linear adjustment sub-module F2 at the other end. The linear voltage ranges of the linear adjustment sub-modules F1 and F2 may have different linear coefficients and different saturation voltages because the linear adjustment sub-modules F1 and F2, although having the same circuit structure, incorporate semiconductor devices with different characteristics. For example, the linear adjustment sub-module F1 may include a differential voltage-to-current conversion circuit configured to a current signal Imod1 converted from the difference between the reference voltage Vref1 and the voltage of the adjustment signal COMP. When the voltage of the adjustment signal COMP drops from the maximum, the current Imod1 output from the differential voltage-to-current conversion circuit may decrease linearly with it at a coefficient a1. When the voltage of the adjustment signal COMP further drops to a value where the current output from the differential voltage-to-current conversion circuit reaches a saturation point, the differential voltage-to-current conversion circuit will start outputting the constant current. The current Imod1 may be output to a signal integration sub-module. The linear adjustment sub-module F2 may have a circuit structure similar to that of the linear adjustment sub-module F1, and a current Imod2 therefrom may be also output to the signal integration sub-module. Hence, no further detailed description of this linear adjustment sub-module is deemed necessary.

It is to be noted that the circuit structure of each of above linear adjustment sub-module is merely exemplary, and should not be construed to limit the scope of the present application in any sense. Indeed, taking the advantage of an electrical characteristic of a semiconductor device, each linear adjustment sub-module allows the whole voltage of the adjustment signal COMP to be encompassed within a linear voltage range of a differential amplifier. In some other embodiments, the segment-wise linear adjustment sub-module may include more linear adjustment sub-modules and may convert the voltage of the adjustment signal COMP into currents Imod-i (the suffix i refers to the i-th linear adjustment sub-module) based on more different linear coefficients.

The signal integration sub-module may be coupled to each linear adjustment sub-modules and configured to linearly integrate the electrical signal from these linear adjustment sub-modules into a converted adjustment signal.

The signal integration sub-module may obtain the converted adjustment signal by integrating the currents Imon-i from the linear adjustment sub-modules based on their respective weights. The signal integration sub-module may include resistors Ri, which are coupled to the respective linear adjustment sub-modules and have resistances determined based on their respective weights. In some particular examples, the signal integration sub-module may output the adjustment signal resulting from the integration to the switch-off delay logic sub-module. In some other specific examples, the signal integration sub-module may further include a sampling resistor configured to sample the converted adjustment signal and thereby obtain a voltage signal Vmod representing the converted adjustment signal. The voltage signal Vmod may be output as a reference voltage to the switch-off delay logic sub-module.

The switch-off delay logic sub-module may be configured to receive the control signal for the switching circuit, start a time for counting down the switch-off delay period of the switching circuit based on the control signal and the converted adjustment signal and output the second logic signal for causing the switching circuit to be switched on when the switch-off delay period expires.

The switch-off delay logic sub-module may include a timing circuit component including a capacitor (or a clock signal counter) for producing a voltage Vramp2 indicating the timer value and a comparator for comparing the voltage Vramp2 with the voltage Vmod of the converted adjustment signal. When Vramp2 reaches the voltage Vmod of the converted adjustment signal, the comparator may output the second logic signal.

In order to avoid logic errors, the second logic signal may result from a logic process performed on an electrical signal output from the comparator in the switch-off delay logic sub-module. For example, as shown in FIG. 16, the switch-off delay logic sub-module may receive the control signal for the switching circuit GATE_ON, which may be the same control signal as received by the aforementioned first timer sub-module. The control signal GATE_ON may be configured to control a switch S51. When the switch S51 is switched off, a constant current source may start charging the capacitor C4, and the capacitor C4 may output the voltage Vramp2 that indicates the value of a charge timer. The comparator may compare the voltage Vramp2 with the voltage Vmod. When Vramp2≥Vmod, the comparator may output a high level. In order to prevent the switching circuit in a switched-on state from being mistakenly switched off, the switch-off delay logic sub-module may further include a control logic for the control signal GATE_ON and the voltage signal output from the comparator. The control logic may consist of a NOT gate and an AND gate and configured to output the second logic signal Toff_min both when the control signal GATE_ON dictates to switch off the switching circuit and when the voltage signal from the comparator indicates the expiry of the timer. The second logic signal Toff_min may be also output to the logic control module.

It is to be noted that the circuit structure of the switch-off delay logic sub-module shown in FIG. 16 is merely exemplary and should not be construed to limit the scope of the present application in any sense. Indeed, depending on the switching control logics of the high and low levels of the control signal GATE_ON and on the design of signal voltages received respectively at non-inverting and inverting inputs of the comparator, the second logic signal may also be produced by a control logic consisting of other logic elements or sets of logic elements in the switch-off delay logic sub-module.

It is to be also noted that, depending on the design requirements of the practical application, either or both of the switch-on and switch-off delay logic modules may be arranged in the control circuit. Adjustment accuracy and granularity in the former case will be slightly inferior compared to those in the latter case.

The logic control module may be coupled to the switch-on and switch-off delay logic modules and configured to cause switching-on and-off of the switching circuit based on a control logic of the first and second logic signals. The logic control module may include logic elements or sets of logic elements for enabling the control logic. Examples of the logic elements or sets of logic elements may include, but are not limited to, at least one of AND gates, OR gates, NAND gates, NOT gates, encoders, decoders, selectors, latches, flip-flops and the like, and various combinations thereof.

In some examples, the control signal from the logic control module may cause switching off of the switching circuit when the logic control module receives the first logic signal (or when the first logic signal is active) and cause switching on of the switching circuit when the logic control module receives the second logic signal (or when the second logic signal is active). For example, the logic control module may include a flip-flop having a reset terminal for receiving the first logic signal and a set terminal for receiving a signal resulting from processing of the second logic signal and the demagnetization signal. When the first logic signal is active, the flip-flop may output a low level to cause the switching circuit to be switched off. When the signal resulting from processing of the second logic signal and the demagnetization signal is active, the flip-flop may output a high level to cause the switching circuit to be switched on.

In other examples, the logic control module may be also configured to receive the demagnetization signal from the aforementioned demagnetization detection unit and control switching-on and-off of the switching circuit based on a control logic of the first logic signal, second logic signal and the demagnetization signal. Both the second logic signal and the demagnetization signal may be configured to cause the switching circuit to be switched on. To this end, the logic control module may include a logic element or set of logic elements for detecting switching on of the switching circuit. The logic element or set of logic elements may be configured to cause switching on of the switching circuit based on an active state of the received second logic signal or demagnetization signal, whichever incomes later. For example, the logic control module may be configured with a control logic with the output control signal causing switching on of the switching circuit both when the second logic signal or the demagnetization signal, whichever incomes later, is active and when the first logic signal is inactive, or causing switching off of the switching circuit both when the first logic signal is active and when the second logic signal and the demagnetization signal are both inactive.

It is to be noted that, as will be appreciated by those skilled in the art, the control logic may be practically designed based on the timing and durations of active states of the first logic signal, the second logic signal and the demagnetization signal, without being limited to the circuit structure as described hereinabove.

Figure 18:
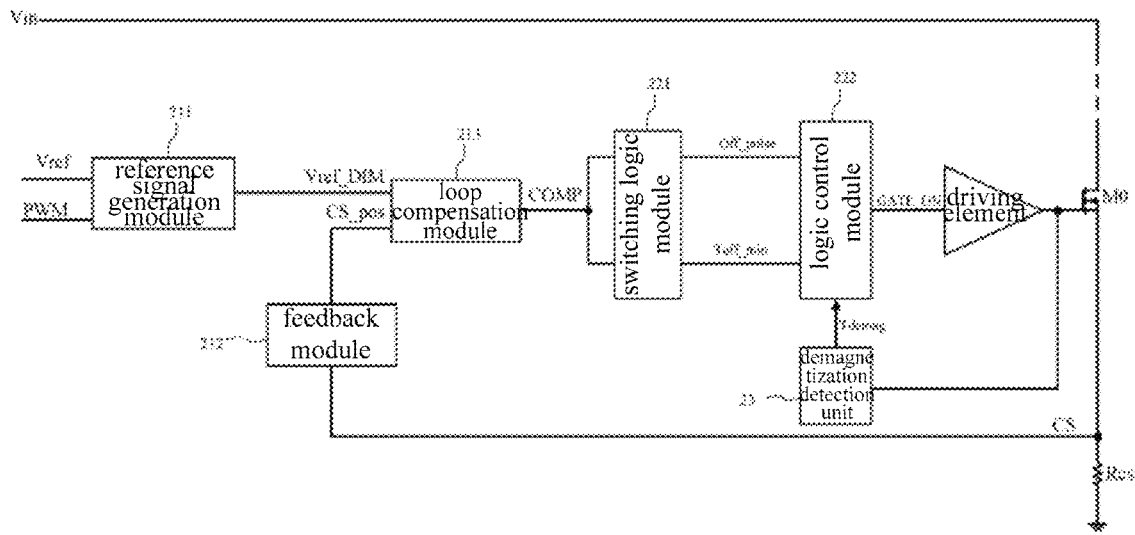
FIG. 18 shows a structural schematic of a control circuit according to an embodiment of the present application.

Based on the description of the above examples, reference is now made to FIG. 18, a structural schematic of the control circuit according to an embodiment. With the control circuit being configured for power supply control of an LED light as an example, an operation of the control circuit to dim the LED light from maximum brightness to minimum brightness will be described below by way of example.

As shown in FIG. 18, the control circuit may be electrically connected to the main control circuit disposed upstream thereof in order to receive a dimming signal (PWM signal) from the main control circuit. The PWM signal may be fed to the reference signal generation module 211 and cause the switches S11 and S12 therein to produce a reference signal Vref_DIM with the same duty cycle as the PWM signal and having a high level equal to a predefined voltage Vref. The feedback module 212 in the control circuit may detect, based on an electrical signal CS sampled from the circuit line where the switching circuit is arranged, a voltage that reflects a power supply situation of the LED light within a switch-on and-off cycle, and output a corresponding feedback signal CS_pos. The loop compensation module 213 may process the reference signal Vref_DIM and the feedback signal CS_pos into an adjustment signal COMP and then output the adjustment signal COMP. The voltage of the adjustment signal COMP within the current switch-on and-off cycle may indicate the power supply situation of the LED light under the control of adjustment metric information (i.e., duty cycle) indicated in a current value of the reference signal. The adjustment signal COMP may be output to the switching logic module 221, which may include the switch-on and switch-off delay logic modules (both not shown). The switch-on logic module may be configured to start, by a capacitor and with the voltage of the adjustment signal COMP as a threshold voltage, a timer for counting down a switch-on period upon the switching circuit being switched on, and generate a first logic signal Off_pulse upon expiry of the switch-on period. The switch-off delay logic module may be configured to convert the adjustment signal COMP on the basis of multiple linear adjustment segments configured based on a voltage range of the adjustment signal COMP and start a timer for counting down a switch-off delay period by using the voltage of the converted adjustment signal COMP as a threshold voltage, upon the switching circuit being switched off, and output a second logic signal Toff_min upon the expiry of the switch-off delay period. In a switched-off state of the switching circuit, the demagnetization detection unit 23 in the control circuit may detect demagnetization of an inductor in the power conversion circuit (not shown) and output a demagnetization signal during the demagnetization detection period. The logic control module 222 in the control circuit may receive the first logic signal Off_pulse, the second logic signal Toff_min and the demagnetization signal Tdemag and output, based on a control logic of the three signals, a control signal for causing the switching circuit to be switched on or off.

A maximum value of the duty cycle of the received PWM signal may correspond to the maximum brightness of the LED light, the highest voltage of the adjustment signal indicating the adjustment metric information, denoted at Vcomp_max, the highest voltage of the adjustment signal COMP output from the loop compensation module, the longest switch-on period and the shortest switch-off delay period. The switch-off delay period may be shorter than the time required by the demagnetization process. A reduction in the duty cycle of the received PWM signal (reference signal) may lead to a corresponding drop in the voltage of the adjustment signal COMP output from the loop compensation module from Vcomp_max, and hence to a corresponding shortening of the switch-on period caused by the switch-on logic module and an extension of the switch-off delay period caused by the switch-off delay logic module. When the switch-off delay period is extended to be longer than the time required by the demagnetization process as a result of the decreasing voltage of the adjustment signal COMP, a change will occur in the switch-off period of the switching circuit.

Figure 19:
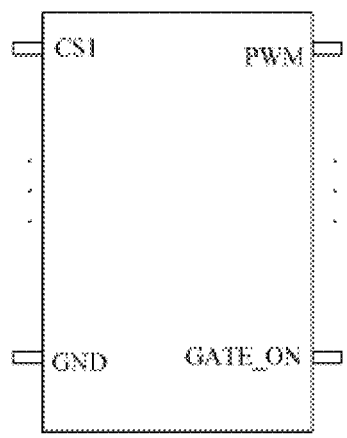
FIG. 19 schematically illustrates a packaged chip according to the present application.

A control circuit as set forth in any of the foregoing embodiments may be integrated as a whole or in part into a chip. Reference is now made to FIG. 19, a schematic illustration of such a chip in a packaged configuration. The chip may have a plurality of pins, including: a first pin (CS1) for capaturing a sampled electrical signal; a second pin (GND) to be grounded; a third pin (GATE_ON) for outputting a control signal; a fourth pin (DIM) for receiving a reference signal (or PWM signal). When the control circuit is powered by an external constant-voltage power supply, the chip may additionally have a fourth pin (Vt) for connecting the constant voltage power supply. The first pin may be coupled to a sampling unit, and the control circuit may be coupled to an input of a switching circuit via the third pin (GATE_ON). For example, the control circuit may be coupled to a control terminal (e.g., an enable terminal) or an input terminal of a driving unit in the switching circuit through the third pin. In case of the control circuit including a demagnetization detection unit, the chip may further have a fifth pin (CS2) configured for demagnetization detection. The fifth pin and the first pin may be provided either by a common pin or by separate pins.

In some embodiments, the reference signal may be provided to an internal circuit of the chip via the pin, and a reference signal generation module and a PWM signal generation module in the control circuit may be both disposed out of the chip. Alternatively, the PWM signal for producing the reference signal may be provided to an internal circuit of the chip via the pin, and the reference signal generation module in the control circuit may be integrated in the chip and coupled to the PWM signal generation module via the pin of the chip. Depending on the practical design requirements of the chip, the PWM signal generation module may also be integrated therein. The reference signal generation module and PWM signal generation module as mentioned here may have a circuit structure and functions identical or similar to those of the reference signal generation module and PWM signal generation module as set forth in the above control circuit examples, and will therefore not be described once again.

In some embodiments, the control circuit may be integrated into the same chip as the driving element in the switching circuit. The driving element may be configured to drive a switching element arranged in a power supply line for the load under the control of the control circuit. The driving element may include a driver amplifier. An electrical signal that has been amplified by the driver amplifier may be used to drive a gate of a switching power transistor in the switching element so that a gate-drain voltage of the switching power transistor can reach a turn-on voltage thereof. Accordingly, in addition to the above-described first and second pins, the chip incorporating the control circuit and the driving element may further include at least a sixth pin configured to be coupled to an input of the switching element in order to output a driving signal.

In some other embodiments, the power control circuit and switching circuit may be integrated in the same chip. In this case, both the driving and switching elements of the switching circuit are integrated in the same chip. As can be seen from the above examples of coupling of the control circuit to the driving and switching elements, this chip may have pins, including the above first and second pins, as well as a seventh pin and an eighth pin for connecting the input (e.g., a drain terminal) and output (e.g., a source terminal) of the switching element to a circuit line on the load side, respectively.

It is to be noted that the switching element as set forth in any of the foregoing embodiments may further include any of a bipolar junction transistor (BJT), a junction-gate field-effect transistor (JFET), a depletion MOS power transistor and a thyristor.

In some other embodiments, the loop compensation module in the control circuit may include a transconductance amplifier and a filtering capacitor Ccomp. Since the filtering capacitor Ccomp is difficult to be integrated, the chip may further have a ninth pin (COMP) for connecting the filtering capacitor.

It is to be also noted that the chip may be further integrated therein with, among others, a clock signal generator for providing a clock signal to the control circuit, a constant voltage source for providing a reference voltage or the like to the control circuit.

For example, in an LED lighting device incorporating an LED light (i.e., a load), a rectifier circuit, the switching circuit, the power conversion circuit, the control circuit and other components, the entire or part of the control circuit, or the control circuit together with at least part of the switching circuit may be integrated into a chip, which may be connected by the pins as set forth in the above examples to an external circuit.

Figure 20:
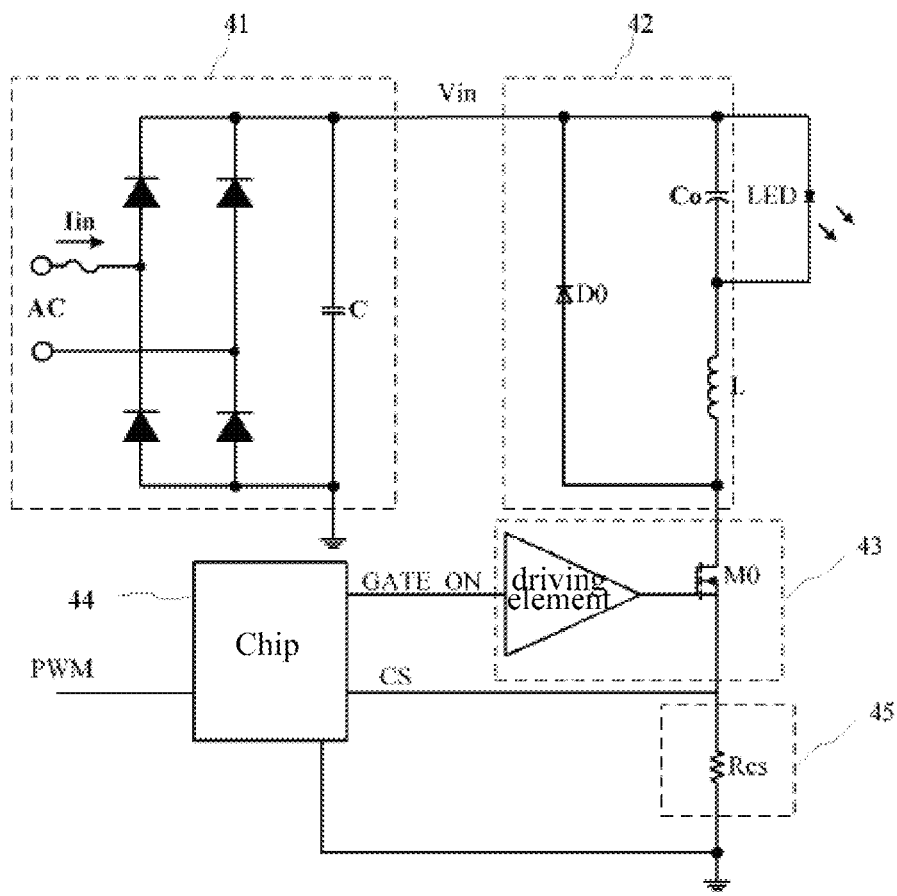
FIG. 20 shows a structural schematic of a driving system according to the present application.

Reference is now made to FIG. 20, a structural schematic of a driving system constructed in accordance with the present application, which includes a chip containing a control circuit as defined above. The driving system can be used to drive an LED light. The driving system includes a rectifier circuit 41, a switching circuit 43, a power conversion circuit 42 and a chip 44.

The rectifier circuit 41 may be configured to rectify incoming AC power and output it to a power bus. As shown in FIG. 20, the rectifier circuit 41 may include a diode bridge rectifier and a capacitor, which are configured to rectify the AC power into half-sine power waves and output the waves to the power bus. The power bus may be configured to power the operation of all the switching circuit, the power conversion circuit, the chip and a driven load (e.g., an LED light).

The switching circuit 43 may be configured to control power supplied by the power bus to the load by switching on or off, under the control of the chip 44, a line circuit (i.e., a power supply line for the load) connected to the power bus. The switching circuit may include a driving element and a switching element. The driving element may include, for example, a driver amplifier having an input for receiving a driving control signal and an output coupled to the switching element. The switching element may include, for example, a switching power transistor having a gate coupled to the output of the driver amplifier. A drain and a source of the switching power transistor may be both connected to the power bus. The switching element may further include any of a bipolar junction transistor (BJT), junction-gate field-effect transistor (JFET), a depletion MOS power transistor and a thyristor.

As a result of switch-on and switch-off operations of the switching circuit 43, the power conversion circuit arranged in the line circuit may generate current oscillations, and the load may be powered based on such current oscillations. The power conversion circuit may include, for example, an LC power conversion circuit.

The line circuit, in which the switching circuit and the power conversion circuit are arranged, may be further provided with a sampling unit for providing sampled electrical signal to the chip. As shown in FIG. 20, the sampling unit 45 may be arranged between the switching circuit 43 and a voltage ground. The chip 41 may be coupled to the sampling unit 45 via the first pin CS. In some examples, the chip 41 may be configured to: detect, based on the sampled electrical signal, a power supply situation of the load under the control of a current value of a reference signal and generate a feedback signal; output an adjustment signal based on both the feedback signal and the reference signal; and adjust switch-on and switch-off periods of the switching circuit based on adjustment metric information indicated in the adjustment signal. It may also be configured to: detect a demagnetization process in the power conversion circuit based on the sampled electrical signal and generate a corresponding demagnetization signal; and cause the switching circuit to be switched on based on the demagnetization signal and the adjustment metric information indicated in the adjustment signal.

According to the above chip examples, the switching circuit in the driving system or the switching circuit may be integrated in the chip, thereby reducing the number of combinations of external electrical components.

Figures 21, 22:
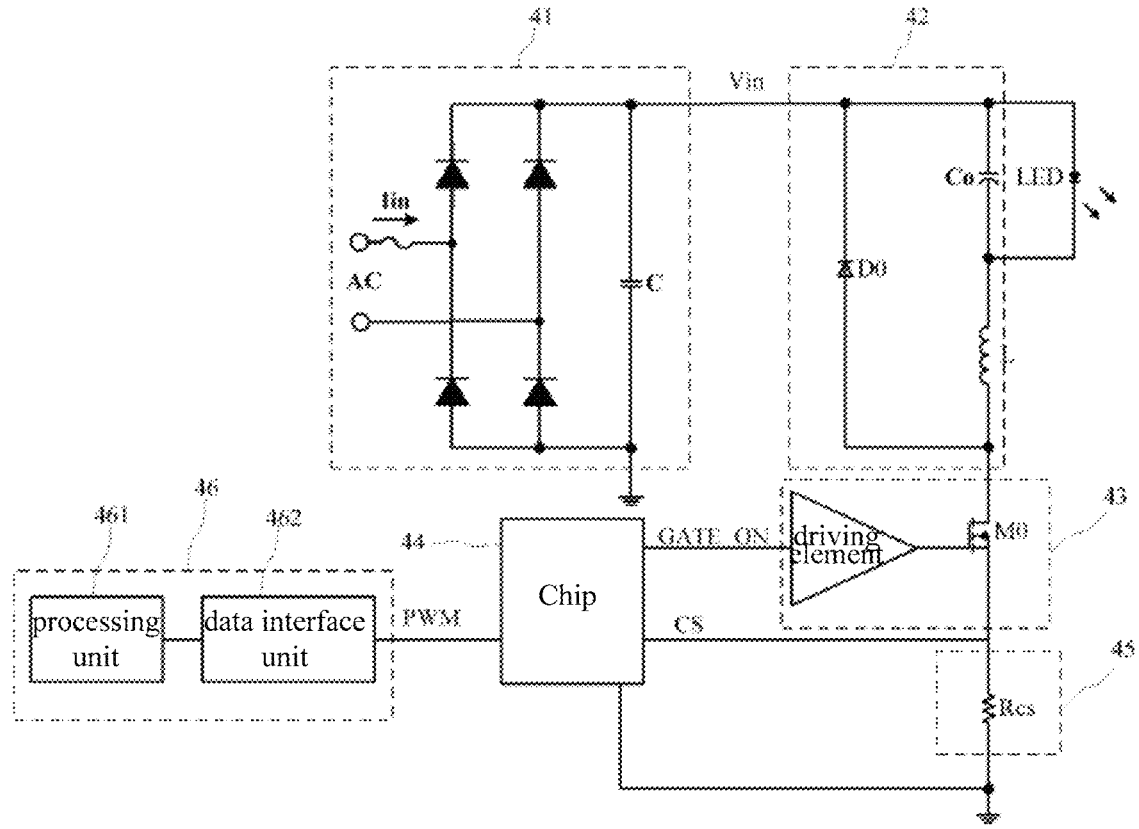
FIG. 21 shows a structural schematic of another driving system according to the present application.
FIG. 22 shows a flowchart of a control method according to an embodiment of the present application.

Reference is now made to FIG. 21, a structural schematic of the driving system according to another embodiment. As shown, the driving system may further include a main control circuit coupled to the chip by a data connection. For example, the main control circuit may be coupled to the fourth pin of the chip and configured to output the reference signal to the chip based on an adjustment control command generated from an operation of a user.

The rectifier circuit, switching circuit, power conversion circuit and chip in the driving system, as well as related peripheral circuitry, may be disposed on the load side. The main control circuit may be disposed either on the load side or in a human-machine interaction interface.

As shown in FIG. 21, the main control circuit 46 may include at least a data interface unit 462 and a processing unit 461. The data interface unit 462 may include, but is not limited to, a wireless network interface module, a data line interface module, etc. The wireless network interface module may be implemented as, for example, a radio frequency (RF)-based network interface module, a ZigBee-based network interface module, a WiFi-based network interface module, a mobile communication-based network interface module or the like. The data line interface module may be implemented as, for example, a USB-based interface module, an RS-232-based interface module or the like. The processing unit 461 may be connected to both of the wireless network interface module and the data line interface module and configured to convert the adjustment control command acquired by the wireless network interface module into the reference signal and output the reference signal to the control circuit via the data line interface module. For example, the main control circuit may be communicatively coupled to the user's mobile device through the wireless network interface module and acquire the adjustment control command resulting from an operation performed by the user on the mobile device, and the processing unit 461 may convert the adjustment control command into the reference signal, which duty cycle contains adjustment metric information. In other examples, the main control circuit 46 may include the human-machine interaction interface (not shown) connected to the processing unit 461 via the data interface unit 462, and the user may manipulate the human-machine interaction interface to result in the adjustment control command. Examples of the human-machine interaction interface may include touch panels, buttons, scroll wheels and the like.

For some LED lights, the main control circuit in the driving system may be disposed in the human-machine interaction interface that is embedded in a wall. In such scenarios, a switch in the human-machine interaction interface may be wired to the rectifier circuit so as to form an AC power supply circuit, and the main controller may be wired to the chip in order to enable the transmission of a PWM signal. The user may issue the adjustment control command to the main control circuit by manipulating option buttons on the human-machine interaction interface, and the processing unit in the main control circuit may convert the adjustment control command into the PWM signal, which may be then output via the data interface unit to the control circuit in the chip. The control circuit may responsively adjust brightness of the LED light in accordance with any of the foregoing embodiments, which have been described above and will therefore not be described once again.

For some other LED lights, the main control circuit in the driving system may be arranged on a printed circuit board (PCB) together with the rectifier circuit, the switching circuit, the power conversion circuit, the chip and related peripheral circuitry. In such scenarios, the use may manipulate an intelligent terminal device to communicate the adjustment control command to the main control circuit, and the processing unit in the main control circuit may convert the adjustment control command into the PWM signal, which may be then output via the data interface unit to the control circuit in the chip. The control circuit may responsively adjust brightness of the LED light in accordance with any of the foregoing embodiments, which have been described above and will therefore not be described once again.

Reference is now made to FIG. 22, a flowchart of a control method according to the present application. The control method can be implemented principally by the control circuit as set forth in any of the above embodiments. Alternatively, it may also be implemented by any other control circuit suitable for implementing the method. The control circuit is configured to control a switching circuit using an acquired reference signal so that switch-on and switch-off periods of the switching circuit can be changed to adjust power supplied to a load. For easy description, the control circuit may include all the components as mentioned above, and in some examples, each of these components may include modules and sub-modules for performing corresponding steps in the method.

In step S110, an electrical signal reflecting a power supply situation of the load under the control of a current value of the reference signal is detected, and a feedback signal is generated.

The electrical signal reflecting the power supply situation of the load may be described with an average voltage, a segment-wise average voltage, a real-time average or the like of power supplied to the load over a switch-on and-off cycle. The reference signal may be a pulse signal with a pulse width adjustable in each pulse cycle and with a duty cycle containing adjustment metric information for power supplied to the load. For example, a duty cycle value of 100% indicates a maximum average current, 0% indicates a minimum average current, and a percentage between 0% and 100% indicates an average current between the maximum and minimum values, for powering the load. There may be a linear or segment-wise linear relationship between the duty cycle and average load current. In this way, the duty cycle of the reference signal contains adjustment metric information for power supplied to the load. The duty cycle of the reference signal may also be considered as an expression of such adjustment metric information.

In some embodiments, the reference signal may be directly provided by a main control circuit. The main control circuit and the control circuit are generally separate circuits, which are connected to each other by an interface circuit. In some examples, the main control circuit may include at least a data interface unit and a processing unit. The data interface unit may include, but is not limited to, a wireless network interface module, a data line interface module, etc. The wireless network interface module may be implemented as, for example, a radio frequency (RF)-based network interface module, a ZigBee-based network interface module, a WiFi-based network interface module, a mobile communication-based network interface module or the like. The data line interface module may be implemented as, for example, a USB-based interface module, an RS-232-based interface module or the like. The processing unit may be connected to both of the wireless network interface module and the data line interface module and configured to convert an adjustment control command acquired by the wireless network interface module into the reference signal and output the reference signal to the control circuit via the data line interface module. For example, the main control circuit may be communicatively coupled to a user's mobile device through the wireless network interface module and acquire the adjustment control command resulting from an operation performed by the user on the mobile device, and the processing unit may convert the adjustment control command into the reference signal, which duty cycle contains adjustment metric information. In other examples, the main control circuit may include a human-machine interaction interface connected to the processing unit via the data interface unit, and the user may manipulate the human-machine interaction interface to result in the adjustment control command. Examples of the human-machine interaction interface may include touch panels, buttons, scroll wheels and the like.

In some other embodiments, the reference signal may be generated from a signal with an adjustable pulse width (e.g., a PWM signal) provided by the main control circuit. To this end, the control method may further include a step of outputting, based on a predefined voltage, the reference signal, which duty cycle is matched with a duty cycle of the acquired PWM signal. This step can be carried out by the reference signal generation module in the control circuit. The reference signal generation module may be embedded with, or externally connected to, a constant voltage source, from which the predefined voltage Vref is received. In one embodiment, the reference signal generation module may include a buffer Buffer and a chopper circuit. The buffer Buffer may be configured for isolation and to buffer and output the predefined voltage Vref. The chopper circuit may be configured to output, under the control of the PWM signal, the reference signal at a high level equal in magnitude to the voltage Vref or at a low level equal in magnitude to a voltage ground. Reference is now made to FIG. 3, a circuit diagram of the reference signal generation module according to one embodiment. As shown, the chopper circuit may include switches S11, S12 and a NOT gate NG. The NOT gate NG may have an input and an output, which are coupled respectively to control terminals of the switches S11 and S12. The NOT gate NG may receive, from the main control circuit, the PWM signal with an adjustable pulse width for adjusting power supplied to the load. Correspondingly, the reference signal generation module may output, under the control of the chopper circuit, a square-wave signal with a duty cycle matched with that of the PWM signal, as the reference signal Vref_DIM. Here, depending on the structure of the control circuit for adjusting power supplied to the load, the "matching" between the duty cycles of the reference signal and the received PWM signal is intended to mean that the two signals have identical or complementary waveforms. As an example, for the PWM signal with a larger duty cycle, the reference signal output from the adjustment signal generation unit may contain adjustment metric information indicating an increase to be effected in power supplied to the load. As another example, for the PWM signal with a larger duty cycle, the reference signal output from the adjustment signal generation unit may contain adjustment metric information indicating a decrease to be made in power supplied to the load.

In some other embodiments, step S110 may further include generating, based on the acquired control command, the PWM signal, from which the reference signal is generated. The control command may be acquired from a data communication connection between the main control circuit and the control circuit. The data communication connection may be implemented as, but is not limited to, a wireless communication connection or a wired communication connection. For example, the control command may be transmitted in a wireless communication connection between the main control circuit and the control circuit and indicate an adjustment percentage, and the PWM signal generation module in the control circuit may obtain the adjustment percentage by demodulating and decoding the received control command and output the PWM signal with a duty cycle corresponding to the adjustment percentage. Alternatively, the control command may be acquired from an electrical connection between the human-machine interaction interface and the control circuit. For example, with the electrical connection between the human-machine interaction interface and the control circuit, the user may manipulate the human-machine interaction interface to configure pulse width, cycle and other settings of an internal signal generator so that a corresponding analog signal is output, and the PWM signal generation module in the control circuit may receive the analog signal, adjust the duty cycle of the generated PWM signal based on the received analog signal and output the adjusted PWM signal. As practically needed in circuit design, the generated PWM signal as set forth in any of the foregoing embodiments may be either directly used as the reference signal, or provided to the reference signal generation module mentioned in those embodiments, which then generates, from the PWM signal, the reference signal that can be identified within the control circuit.

In order to obtain an adjustment signal better conveying adjustment metric information, step S110 may include: acquiring the electrical signal sampled from the switching circuit; detecting, based on the sampled electrical signal, a voltage reflecting the power supply situation of the load within a switch-on and-off cycle; and outputting a corresponding feedback signal.

The electrical signal may be sampled from the switching circuit or from a line between the switching circuit and power bus and reflect a change in the power supply situation of the load under the control of the current value of the reference signal, and the adjustment signal generation unit 21 in the control circuit may detect a change in the electrical signal and generate a feedback signal indicative of the change in the electrical signal. The electrical signal may be sampled by a sampling unit arranged in the same line as the switching circuit. Reference is now made to FIG. 4, a structural schematic of the control circuit incorporated in a driving system. As shown, the sampling unit 13 may be arranged between the switching circuit and the ground and configured to output a sampled signal CS. The electrical signal may alternatively be sampled from an internal port of the switching circuit and reflect the power supply situation of the line in which the switching circuit is arranged. For example, the electrical signal may be sampled from a gate or drain of a power transistor in the switching element in the switching circuit 12. The change in the electrical signal may be described with an average voltage, a segment-wise average voltage, a real-time average or the like in the circuit line where the switching circuit is arranged over one switch-on and-off cycle.

To this end, step S110 may further include generating, based on a peak voltage of the sampled electrical signal acquired in a switched-on state of the switching circuit, the feedback signal, which is an electrical signal reflecting the power supply situation of the load over the switch-on and-off cycle, and outputting the feedback signal.

Reference is now made to FIG. 5, a schematic illustration of the architecture of the adjustment signal generation unit in the control circuit. As shown, the adjustment signal generation unit 21 may include a feedback module 212 configured to acquire the electrical signal sampled from the switching circuit, which is arranged in the same electrical circuit as the switching circuit. In the example of FIG. 5, the sampling unit 13 is arranged between the switching element in the switching circuit 12 and the ground and configured to output the sampled electrical signal CS in a switched-on state of the switching circuit 12 and output a low-level signal (e.g., 0 V) in a switched-off state of the switching circuit 12. The feedback module 212 may detect an average voltage of the sampled electrical signal over the switch-on and-off cycle, and the feedback signal CS_pos output therefrom may have an amplitude equal to the average voltage.

In one example, the feedback module is configured to perform a step of generating, based on the sampled electrical signal acquired in a switched-on state of the switching circuit, the feedback signal, which is a voltage reflecting the power supply situation of the load over one switch-on and-off cycle, and outputting the feedback signal. Examples of the voltage reflecting the power supply situation of the load over one switch-on and-off cycle may include, but are not limited to, an average voltage, a segment-wise average voltage, a real-time average, etc. in the circuit line where the switching circuit is arranged, over one switch-on and-off cycle.

In some particular examples, an average voltage in the circuit line where the switching circuit is arranged over one switch-on and-off cycle may be proportional to a peak voltage within the specific switch-on and-off cycle, and the feedback module may generate, based on a peak voltage of the sampled electrical signal acquired in a switched-on state of the switching circuit, the feedback signal, which is an electrical signal reflecting the power supply situation of the load over the switch-on and-off cycle, and output the feedback signal.

The feedback module may include a first signal processing sub-module and a first logic processing sub-module. The first signal processing sub-module may be configured to perform a voltage averaging process on the acquired sampled electrical signal and output the feedback signal. The first logic processing sub-module may be coupled to the first signal processing sub-module and configured to be based on a control signal for the switching circuit to cause the signal processing sub-module to output the feedback signal on the basis of the switch-on and-off cycle.

Reference is now made to FIG. 6, a circuit diagram of the feedback module according to an embodiment, and to FIG. 7, a schematic illustration of signals labeled in FIG. 6. As shown, the first signal processing sub-module may include a capacitor C1, an amplifier and resistors R1 and R2. The first logic processing sub-module may include switches S21 and S22. As shown in FIG. 6, the first logic processing sub-module may receive the control signal GATE_ON output from the control unit to the switching circuit. When GATE_ON is at a high level, the first signal processing sub-module switch S21 is switched on, with the switch S22 being opened. As a result, the capacitor C1 is charged by the sampled electrical signal CS. When GATE_ON is at a low level, switch S21 is opened, with the switch S22 being closed. Consequently, the voltage of the electrical signal on a terminal CS_S of the capacitor C1 is fed to a non-inverting input CS_H of the amplifier with a closed-loop gain, processed by the amplifier and output to the resistors R1 and R2, which then divide the voltage of the electrical signal and output the feedback signal CS_pos that corresponds to the resulting average voltage of the electrical signal. Variations of the electrical signal during the operation of the circuit structure of FIG. 6 are shown in FIG. 7. The first signal processing sub-module may obtain a peak voltage of the sampled electrical signal CS at the beginning of one switch-on and-off cycle (T1+T2), and depending on a relationship between the amplifier's gain and the resistances of the resistors R1 and R2, the output feedback signal CS_pos may have a voltage equal to 50% or another fraction of the peak voltage of the sampled electrical signal CS. With this circuit structure, the feedback signal CS_pos output from the feedback module may indicate an average voltage in the circuit line where the switching circuit is arranged over one switch-on and-off cycle (T1+T2).

In another particular example, the power conversion circuit may be included in a driving system for providing a DC power supply, in order to convert rectified power supply waves into more stable DC power supply waves by means of energy conversion enabled by magnetization and demagnetization of an inductor. This operation of the power conversion circuit can be enabled by electric power energy varying in a controlled manner under the action of switching-on and-off of the switching circuit. In order to achieve accurate indication, for the control circuit for adjusting power supplied to the load, the control method may further include step S111 (not shown), in which a demagnetization process in the power conversion circuit that is coupled to the switching circuit is detected, and a demagnetization signal is output. For example, the demagnetization detection unit can be implemented as a demagnetization completion detection module as described in the Publication No. CN107529254A or CN107484305A, all of which are hereby incorporated herein by reference in their entirety. The demagnetization completion detection module may determine the completion of the demagnetization process and generate the demagnetization signal when detecting a voltage valley of the acquired sampled electrical signal. In order to facilitate subsequent logic processing, the demagnetization signal from the demagnetization detection unit may stay active since the switching circuit was switched off, until the completion of the demagnetization process is detected.

For the control circuit for adjusting power supplied to the load, if maximum power being supplied to the load corresponds to a magnetization process being performed in the power conversion circuit in a switched-on state of the switching circuit, with minimum power being supplied to the load corresponding to a demagnetization process being performed in the power conversion circuit in a switched-off state of the switching circuit, then at least one of shortening the switch-on period (i.e., the duration of the magnetization process) and lengthening the switch-off period (i.e., the period after the completion of the demagnetization process) can lead to a reduction in power supplied to the load, i.e., a reduction in the electrical energy converted by the load to another form of energy. In this way, an LED light could be gradually dimmed from the maximum brightness, for example.

Based on both the demagnetization signal and the control signal, the feedback signal generated by the feedback module may more accurately reflect the power supply situation of the load. To this end, step S110 may further include receiving the demagnetization signal and the control signal for the switching circuit and, based upon a control logic of the control signal and the demagnetization signal, outputting the feedback signal generated based on the sampled electrical signal acquired in a switched-on state of the switching circuit.

From the control signal and the demagnetization signal, the feedback module may obtain a peak voltage of the sampled electrical signal within a switch-on and-off cycle, a real-time voltage of the sampled electrical signal in a switched-on state of the switching circuit, or the like. Moreover, from the control signal and the demagnetization signal, the feedback module may determine switch-on and switch-off periods of the switching circuit within one switch-on and-off cycle, and even a demagnetization detection period and an interrupted period in the switch-off period. The interrupted period is a time interval when no power is supplied to the load at all.

To this end, the feedback module may include a second signal processing sub-module and a second logic processing sub-module. The second signal processing sub-module may process the voltage of the acquired sampled electrical signal in accordance with the multiple periods of one switch-on and-off cycle and thereby output the feedback signal. The second logic processing sub-module may be coupled to the second signal processing sub-module and configured to control the outputting of the feedback signal from the signal processing sub-module based on a control logic for the multiple periods of one switch-on and-off cycle, which is configured based on the control signal and the demagnetization signal.

With the output feedback signal reflecting the variation of a voltage in the switch-on period of the switching circuit, the demagnetization detection period and the interrupted period within one switch-on and-off cycle as an example, based on the control logic of the acquired demagnetization signal and the control signal for the switching circuit, in the switched-on state of the switching circuit, under the control of the second logic processing sub-module, the second signal processing sub-module may detect the acquired sampled electrical signal in real time and output the real-time voltage as the feedback signal, and further detect a peak voltage of the sampled electrical signal. In the demagnetization detection period, under the control of the second logic processing sub-module, the second signal processing sub-module may process the peak voltage from the second signal processing sub-module and output the processed signal as the feedback signal. In the interrupted period, under the control of the second logic processing sub-module, the second signal processing sub-module may output the voltage ground as the feedback signal. Thus, the feedback signal from the feedback module can more accurately reflect the variation of a voltage in the switching circuit within one switch-on and-off cycle.

Examples of components of the second signal processing sub-module may include, but are not limited to, amplifiers, capacitors, resistors, buffers and the like. Examples of components of the second logic processing sub-module may include, but are not limited to, at least one of AND gates, OR gates, NAND gates, NOT gates, two-piece switches, transistors, power transistors, as well as, encoders, decoders, selectors, for working with those gates to enable the control logic, and the like, and various combinations thereof.

Reference is now made to FIG. 8, a circuit diagram of the feedback module according to another embodiment, and to FIG. 9, a schematic illustration of signals labeled in FIG. 8.

In this embodiment, the second signal processing sub-module includes, among others, a capacitor C2, an amplifier A, resistors R3 and R4 and a buffer B. The second logic processing sub-module includes switches S31, S32, S33, S34 and a NOR gate NOR_G.

With combined reference to FIGS. 8 and 9, the switching circuit is switched on at a high level of the control signal GATE_ON and off at a low level of the control signal GATE_ON. The demagnetization signal Tdemag stays active (i.e., high) since a transition of the signal GATE_ON to the low level and is deactivated (i.e., low) upon the demagnetization detection unit detecting the completion of the demagnetization process. According to the above-described control logic, the switches S31 and S33 operate under the control of the control signal GATE_ON, the switch S32 under the demagnetization signal Tdemag and the switch S34 under the NOR gate NOR_G. The NOR gate NOR_G controls the switch S34 based on the control signal GATE_ON and the demagnetization signal Tdemag. When the control signal is high (i.e., the switching circuit is being switched on) with the demagnetization signal being low (i.e., detection of the demagnetization process has not been started yet), the switches S31 and S33 are switched on, with the switches S32, S34 being switched off. As a result, the feedback signal CS_pos output from the second signal processing sub-module is the acquired sampled electrical signal CS. At the same time, due to energy storage of the capacitor C2, a voltage at a terminal CS_S thereof varies with that of the sampled electrical signal CS, and the voltage of the sampled electrical signal CS is divided by the amplifier A and the resistors R3, R4, resulting a signal CS_BUF output from the buffer B. When the control signal is low (i.e., the switching circuit is being switched off), with the demagnetization signal being high (i.e., during the detection of the demagnetization process), the switches S31, S33, S34 are switched off, with the switch S32 being switched on. As a result, the feedback signal CS_pos output from the second signal processing sub-module is the signal CS_BUF from the buffer B, which has a voltage as a result of dividing the voltage of the sampled electrical signal CS at the end of the switch-on period of the switching circuit and in relation to an impedance ratio of the voltage of the sampled electrical signal CS and the resistors R3, R4. When the control signal is low (i.e., the switching circuit is being switched off), with the demagnetization signal also being low (i.e., detection of the demagnetization process has not been started yet), the switch S31, S32, S33 are switched off, with the switch S34 being switched on. As a result, the feedback signal CS_pos from the second signal processing sub-module is the voltage ground.

Reference is now made to FIG. 10, a circuit diagram of the feedback module according to a further embodiment, and to FIG. 11, a schematic illustration of signals labeled in FIG. 10. In this embodiment, the second signal processing sub-module includes a capacitor C3, amplifiers A2 and A3 and resistors R5 and R6. The second logic processing sub-module includes switches S41, S42, S43, S44 and is configured to generate a logic signal Tdcm_B based upon the demagnetization signal Tdemag and the control signal GATE_ON. Different levels of the logic signal Tdcm_B indicate whether it is in an interrupted period of a switch-on and-off cycle. For example, as shown in FIG. 11, a high level of the logic signal Tdcm_B may indicate that it is not in an interrupted period, while a low level thereof may indicate that it is now in an interrupted period T3.

In the control logic of the control signal GATE_ON and the logic signal Tdcm_B as shown in FIGS. 10 and 11, when both GATE_ON and the logic signal Tdcm_B are at respective high levels, i.e., in the switch-on period T1 of the switching circuit, the switches S41 and S43 are switched on, while the switches S42 and S44 are switched off. As a result, the feedback signal CS_pos output from the second signal processing sub-module is an average voltage determined based on the start time of the switch-on period of the switching circuit. When GATE_ON is at a low level, with the logic signal Tdcm_B still being at the high level, i.e., in a demagnetization detection period T2, the switches S42 and S43 are switched on, while the switches S41 and S44 are switched off. As a result, the feedback signal CS_pos output from the second signal processing sub-module is an average voltage determined based on the start time of the demagnetization detection period. When both GATE_ON and the logic signal Tdcm_B are at the respective low levels, i.e., in an interrupted period, the switches S42 and S44 are switched on, while the switches S41 and S43 are switched off. As a result, the feedback signal CS_pos output from the second signal processing sub-module is the voltage ground.

It is to be noted that what are shown in FIGS. 6, 8 and 10 are merely examples of the circuit structure of the feedback module, which do not imply any limitation thereon. In practice, the above-described control logic can be implemented by any of other various possible circuit structures based on the logic information of the control signal and the demagnetization signal, which are not detailed herein to avoid obscuring the present application.

In step S120, an adjustment signal indicative adjustment metric information of the reference signal is output based on both the feedback signal and the reference signal.

The adjustment signal may be a signal with a voltage indicative of the duty cycle of the reference signal, or of the difference between an adjustment metric value M1 indicated in the reference signal and an adjustment metric value M2 for the load. An increase in the voltage of the adjustment signal may indicate that the control unit in the control circuit is needed to cause, by controlling the switching circuit, an increase in the power supply current for the load, which corresponds to the metric value indicated by the voltage of the adjustment signal. For example, when the load is an LED light, the voltage of the adjustment signal may contain metric information dictating an adjustment to be made in brightness of the LED light. In this case, in response to an increase of the voltage of the adjustment signal from v1 to v2, the control unit may cause the switch-on period of the switching circuit to extend from t1 to t1', or cause the switch-off period of the switching circuit to be shortened from t2 to t2', so that the value of a metric measuring the adjustment brightness of the LED light (e.g., light intensity) corresponds to the voltage value v2.

In order to be able to output the adjustment signal, step S120 may include performing, based on the reference signal, a low-pass filtering process on the feedback signal and outputting the adjustment signal corresponding thereto.

The loop compensation module may perform differential-integral processes with the reference signal as a reference signal and with the voltage of the feedback signal as an input voltage, and the adjustment signal may be output from the differential-integral process. The feedback signal may reflect a power supply situation of the load under the action of adjustment metric information indicated in a current value of the reference signal. When the change in the reference signal lasts for a time period Δt, the voltage of the adjustment signal resulting from the low-pass filtering process performed by the loop compensation module 213 on the error between the reference signal and the feedback signal may indicate a variation in the adjustment metric within the time period Δt. The time period Δt may be at least equal to a time period required by the feedback module to process the sampled electrical signal, or a unit time interval configured internally in the loop compensation module for the performance of the differential-integral process. For example, assuming the feedback module detects that the load is currently powered with an average voltage v1, a duty cycle P1 of the reference signal and a voltage V1 of the adjustment signal, if the duty cycle of the reference signal is not adjusted within the time period Δt, then the voltage of the adjustment will vary around the average voltage v1 within a stable range. If the duty cycle P1 of the reference signal is decreased (or increased) from P1 to P2, meaning that the average power supply voltage for the load is to be lowered (or raised) from v1' to v2', then the loop compensation module will pull the voltage of the adjustment signal from V1 up (or down) to V2 within the time period Δt by means of differential-integral processing, followed by corresponding adjustments made in the switch-on and switch-off periods of the switching circuit by the control unit based on the changed voltage of the adjustment signal. In this way, a drop (or rise) of the average power supply voltage for the load from v1' to v2' can be enabled.

Reference is now made to FIG. 12, a structural schematic of the control circuit according to some embodiments. In such embodiments, the loop compensation module 213 may include a transconductance amplifier Gm and a filtering capacitor Ccomp. The transconductance amplifier Gm may have a non-inverting input for receiving the reference signal Vref_DIM, an inverting input for receiving the feedback signal CS_pos, and an output coupled to the filtering capacitor Ccomp. The transconductance amplifier Gm and the filtering capacitor Ccomp may make up a low-pass filter, from which the adjustment signal COMP is output. The voltage of the adjustment signal COMP may vary with the duty cycle of the reference signal Vref_DIM.

In some other embodiments, step S120 may include: performing digital differential-integral processes between the feedback signal and the reference signal to generate differential-integral signals; and accumulating a count of the differential-integral signals to convert them to an analog signal as the adjustment signal.

The loop compensation module may perform the digital differential-integral processes on the feedback signal on the basis of a unit interval derived from a clock signal, with the currently detected voltage of the reference signal as a reference voltage, and the resulting differential-integral signals may be digital adjustment signals in the form of high/low levels, which vary with the reference signal on the basis of the unit interval. The unit interval may span one or N cycles of the clock signal, where N>1. In order to be compatible with upstream and downstream circuit components, the output signal from the loop compensation module must be an electrical signal that can be processed by the analog electronic components. To this end, the loop compensation module may accumulate a count of the digital adjustment signals from the differential-integral processes to obtain the adjustment signal that varies in voltage in cycles occurring on the basis of the unit interval. The adjustment signal is an electrical signal reflecting the error between the reference signal and the feedback signal that has experienced low-pass filtering. Depending on the practical circuit design requirements, a frequency of the clock signal, some internal reference voltages (e.g., voltage steps, voltage amplitudes) and analog and digital components may be selected for the loop compensation module based on the circuit's resolution.

For example, reference is now made to FIG. 13, a structural schematic of the loop compensation module according to another embodiment. As shown, the loop compensation module may include a differential-integral sub-module 214 and a digital-to-analog conversion sub-module 215, which operate under the control of pulse signals CLK occurring on the basis of the unit interval.

The differential-integral sub-module 214 may be configured to perform fully differential-integral processes between the feedback signal CS_pos and the reference signal Vref_DIM based on differential-integral signals fed back on the basis of the unit interval, and to output 1-bit differential-integral signals (each of which presents one digital bit). The unit interval may be configured based on an integer number of cycles of an internal clock signal.

With the unit interval as Δt, the differential-integral sub-module 214 may be configured, in accordance with a differential-integral process between $(V_{CS} \pm V_{FS})$ and the voltage $V_{ref\_DIM}$ of the reference signal Vref_DIM, with a circuit structure for performing a differential process selectively between the voltage of the feedback signal CS_pos and a predefined voltage step, or between the voltage of the reference signal Vref_DIM and the voltage step, depending on a differential-integral signal from the previous unit interval, and with another circuit structure for performing an integral process between two signals from the differential process and thus obtaining a 1-bit digital differential-integral signal, which is described by a high/low level and is output for the current unit interval. Here, $V_{CS}$ denotes the voltage of the feedback signal CS_pos, and $V_{FS}$ represents the voltage step, which may be provided either by an internal reference voltage, or by the high voltage level of the differential-integral signal.

The digital-to-analog conversion sub-module 215 may accumulate the differential-integral signals on the basis of the unit interval and thereby convert them into the analog filtered signal.

The digital-to-analog conversion sub-module 215 may include an additive-subtractive counter and a digital-to-analog converter. The additive-subtractive counter may receive the 1-bit differential-integral signals and accumulate a count thereof. The additive-subtractive counter may produce M-bit outputs. During each counting process, the additive-subtractive counter may sample a differential-integral signal on the basis of the unit interval. If the sampled differential-integral signal is at a high level, the additive-subtractive counter may perform an additive operation. If the sampled differential-integral signal is at a low level, the additive-subtractive counter may perform a subtractive operation. Each additive or subtractive operation may lead to an update of the count, which is output as an M-bit binary digital signal to the digital-to-analog converter. The digital-to-analog converter may produce a voltage signal from such received M-bit binary digital signals, as the adjustment signal COMP.

In step S130, the switch-on period and/or switch-off period of the switching circuit is/are adjusted based on the adjustment signal.

Step S130 may be carried out by the control unit in the control circuit. The control unit may include a switch-on logic module, a switch-off delay logic module and a logic control module.

In order to enable adjusting the switch-on period and/or switch-off period of the switching circuit, step S130 may include: keeping a timer for counting down a switch-on period of the switching circuit and/or a switch-off period of the switching circuit, based on the adjustment signal and a control signal for the switching circuit; output a logic signal for controlling switching off and/or on of the switching circuit upon expiry of the timer; and controlling switching off and/or on of the switching circuit based on a control logic of the logic signal for controlling switching off and/or on of the switching circuit.

Reference is now made to FIG. 14, a structural schematic of the control circuit according to an embodiment. The control unit may include a switching logic module and a logic control module.

The switching logic module may be coupled to the adjustment signal generation unit and configured to start a timer for counting down the switch-on period and/or switch-off period of the switching circuit, based on the adjustment signal and the control signal for the switching circuit, and upon expiry of the timer, output a logic signal for causing switching off and/or on of the switching circuit. When counting down the switch-on period, the switching logic module may maintain a logic signal that keeps the control circuit in a switched-on state until the expiry of the timer when it outputs the logic signal for causing the switching circuit to be switched off. When counting down the switch-off period, the switching logic module may maintain a logic signal that keeps the control circuit in a switched-off state until the expiry of the timer when it outputs the logic signal for causing the switching circuit to be switched on. The switch-off period may be determined based on the demagnetization detection period, or on the demagnetization detection period or a switch-off delay period, whichever is longer. Depending on the voltage of the adjustment signal, the switch-off delay period may be adjustable up to a maximum that may be either longer or shorter than the demagnetization detection period.

The switching logic module may include a switch-on logic module coupled to the adjustment signal generation unit and configured to adjust the switch-on period of the switching circuit based on the adjustment signal and output a first logic signal for causing the switching circuit to be switched off when the switch-on period has expired.

With a voltage indicated in the adjustment metric information as a threshold voltage, the switch-on logic module may start a timer for counting down the switch-on period upon the switching circuit being switched on and output the first logic signal when the switch-on period expires. The switch-on logic module may include a first timer sub-module and a first logic sub-module. When capturing the control signal for the switching circuit, the first timer sub-module may be configured to start counting down the switch-on period of the switching circuit if the control signal dictates so and output timing information indicative of the switch-on period of the switching circuit. Examples of the control signal may include, but are not limited to, a control signal output from the control circuit to the switching circuit and a driving signal output from the driving element in the switching circuit to the switching element therein. The timing information may be indicated in a voltage. To this end, the switch-on logic module may include a component that can vary linearly over time and is configured to output a voltage signal indicating a value of the timer.

In one example, referring to FIG. 15, a circuit diagram of the switch-on logic module according to an embodiment, the first timer sub-module may include a set of logic elements L11 and a capacitor C4. The set of logic elements L11 may be configured to acquire the control signal for the switching circuit. The set of logic elements L11 may be configured on the basis of a control logic of the control signal for charging and discharging the capacitor C4. Under the control of the set of logic elements, the capacitor C4 may start being charged when the switching circuit is switched on and start being discharged when the switching circuit is switched off. In the example of FIG. 15, the set of logic elements L11 may include a NOT gate and a switch S41, and the first timer sub-module may be embedded with, or externally connected to, a current source for supplying a charging current Iref to the capacitor C4. The first timer sub-module may be additionally embedded with, or externally connected to, a voltage source for providing the capacitor C4 with a discharge path when it is discharged under the control of the set of logic elements L11 as well as with an initial voltage COMP_ini. Examples of the cut-off device may include backward diodes and resistors. When the control signal for the switching circuit dictates to switch on the switching circuit (i.e., when acquiring a switch-on signal for the switching circuit), the switch S41 may be switched off, allowing the current source to charge the capacitor C4. As a result, a voltage at a terminal of the capacitor C4 will be raised and output to the first logic sub-module. When the control signal for the switching circuit dictates to switch off the switching circuit (i.e., when acquiring a switch-off signal for the switching circuit), the switch S41 may be switched on, allowing the current source to discharge the capacitor C4 to the initial voltage COMP_ini.

It is to be noted that the first timer sub-module shown in FIG. 15 is merely exemplary, and should not be construed to limit the scope of the present application in any sense. The capacitor C3 may also be charged with the high level of the control signal and discharged by using another set of logic elements to cause a line connecting the capacitor C3 to the voltage ground to be switched on and off. Although not detailed herein, there are still many other possible alternative approaches.

In another example, the first timer sub-module may receive a clock signal and include a counter D1 and a set of logic elements L2 operating under the control of the control signal for the switching circuit. When the control signal dictates to switch on the switching circuit (i.e., when acquiring a switch-on signal for the switching circuit), the counter D1 may count the number of cycles of the clock signal and output a voltage indicating the count of cycles. When the control signal for the switching circuit dictates to switch off the switching circuit (i.e., when acquiring a switch-off signal for the switching circuit), the counter D1 may be reset. The set L2 may include logic elements such as flip-flops.

The first timer sub-module may output the timing information in the form of a voltage to the first logic sub-module, which may be configured to output the first logic signal when determining that the timing information is matched with the adjustment metric information. In particular, with the voltage of the adjustment signal COMP from the aforementioned adjustment signal generation unit as a threshold voltage, the first logic sub-module may compare the voltage Vramp1 from the first timer sub-module with the threshold voltage using a comparator. When the voltage Vramp1 reaches the threshold voltage, it may output the first logic signal Off_pulse. As shown in FIG. 15, the comparator may have a non-inverting input for receiving the voltage Vramp1 and an inverting input for receiving the voltage of the adjustment signal COMP. When the voltage Vramp1 rises to the voltage of the adjustment signal COMP, it may output the first logic signal Off_pulse as a high level. It should be noted that, as will be appreciated by those of ordinary skill in the art, whether the first logic signal Off_pulse is active at a high level or at a low level may depend on the subsequent control logic, and the first logic sub-module shown in FIG. 15 is merely exemplary, and should not be construed to limit the scope of the present application in any sense. The first logic signal may be output to the logic control module, which may then execute a switch-off control logic based on the first logic signal and thereby output a control signal for causing the switching circuit to be switched off. The control logic of the logic control module may also be related to a switch-off delay logic module.

The switch-off delay logic module may be included in the switching logic module and coupled to the adjustment signal generation unit. It may be configured to adjust the switch-off delay period for the switching circuit based on the adjustment signal and output a second logic signal for causing the switching circuit to be switched on when the switch-off delay period expires.

In particular, with the voltage of the adjustment signal as a threshold voltage, the switch-off delay logic module may start a timer for counting down the switch-off delay period upon the switching circuit being switched off, and output the second logic signal upon the expiry of the switch-off delay period. In some examples, the switch-off delay logic module may have a circuit structure that is identical or similar to that of the switch-on logic module, and a repeated description thereof can be thus dispensed with.

In some other embodiments, the switch-off delay logic module may adjust the switch-off delay period for the switching circuit based on the adjustment signal in a segment-wise linear manner, in order to achieve an increased adjustment granularity in segments of a power supply range for the load that are around the upper and lower bounds. The switch-off delay period may be equal to the switch-off period of the switching circuit or a fraction thereof. The switch-off delay logic module may include at least one semiconductor device or set of semiconductor devices, which can adjust a voltage based on the adjustment signal. In this case, the switch-off delay period can be adjusted by taking the advantage of a characteristic of the semiconductor device or set of semiconductor devices that varies linearly with the voltage within a range and optionally becomes saturated within another range. For example, in the case that an increase in the voltage of the adjustment signal will lead to a corresponding reduction in the switch-off delay period, when the voltage of the adjustment signal falls within the linear range of the semiconductor device(s) in the switch-off delay logic module, the semiconductor device(s) may convert the voltage of the adjustment signal into a threshold voltage, and a timing component in the switch-off delay logic module, such as a capacitor (or clock signal counter), which utilizes a voltage to indicate timing information, may keep a timer for the switch-off delay period and output the second logic signal when the time expires.

In order to enable segment-wise linear adjustments based on the adjustment signal, the switch-off delay logic module may include a segment-wise linear adjustment sub-module and a switch-off delay logic sub-module.

The segment-wise linear adjustment sub-module may have at least two different linear segments and be configured to receive the adjustment signal and convert it based on the adjustment metric information indicated in the adjustment signal and a corresponding one of the linear segment to the adjustment metric information.

Based on an adjustment metric range corresponding to the voltage of the adjustment signal (e.g., a voltage range of the adjustment signal), a technician may choose a semiconductor device or a set of semiconductor devices in the switch-off delay logic module, with a voltage profile divided into a linear section and a constant section within the adjustment metric range. With this arrangement, the switch-off delay period may be adjusted based on a desired amount of power supplied to the load. In another particular example, the switch-off delay logic module may include multiple semiconductor devices or sets of semiconductor devices having individual linear ranges with respective weights. In this case, in the adjustment metric range corresponding to the adjusting voltage (e.g., the voltage range of the adjustment signal), the switch-off delay period may be adjusted in a segment-wise linear manner with the weights of the individual semiconductor device or sets of semiconductor devices in the respective ranges. In another particular example, the switch-off delay logic module may employ a combination of these two examples to achieve segment-wise adjustment of the switch-off delay period using multiple semiconductor devices or sets of semiconductor devices having individual linear ranges with respective weights and individual saturation ranges.

Reference is now made to FIG. 16, a structural schematic of the switch-off delay logic module according to an embodiment, and to FIG. 17, a diagram of waveforms of electrical signals shown in FIG. 16. The segment-wise linear adjustment sub-module may include at least two linear adjustment sub-modules having different linear profiles. Each of the linear adjustment sub-modules may be based on its own linear profile to convert the received adjustment signal. The different linear profiles may include, but are not limited to, at least one of different saturation voltages of the linear adjustment sub-modules and different linear voltage coefficients of the linear adjustment sub-modules. As shown in FIG. 16, the segment-wise linear adjustment sub-module may include a linear adjustment sub-module F1 and another linear adjustment sub-module F2. As shown in FIG. 17, the linear adjustment sub-module F1 may have a linear voltage range bounded by a reference voltage Vref1 at one end and by a saturation voltage of a semiconductor device or a set of semiconductor devices in the linear adjustment sub-module F1 at the other end. The linear adjustment sub-module F2 may have a linear voltage range bounded by a reference voltage Vref2 at one end and by a saturation voltage of a semiconductor device or a set of semiconductor devices in the linear adjustment sub-module F2 at the other end. The linear voltage ranges of the linear adjustment sub-modules F1 and F2 may have different linear coefficients and different saturation voltages because the linear adjustment sub-modules F1 and F2, although having the same circuit structure, incorporate semiconductor devices with different characteristics. For example, the linear adjustment sub-module F1 may include a differential voltage-to-current conversion circuit configured to a current signal Imod1 converted from the difference between the reference voltage Vref1 and the voltage of the adjustment signal COMP. When the voltage of the adjustment signal COMP drops from the maximum, the current Imod1 output from the differential voltage-to-current conversion circuit may decrease linearly with it at a coefficient a1. When the voltage of the adjustment signal COMP further drops to a value where the current output from the differential voltage-to-current conversion circuit reaches a saturation point, the differential voltage-to-current conversion circuit will start outputting the constant current. The current Imod1 may be output to a signal integration sub-module. The linear adjustment sub-module F2 may have a circuit structure similar to that of the linear adjustment sub-module F1, and a current Imod2 therefrom may be also output to the signal integration sub-module. Hence, no further detailed description of this linear adjustment sub-module is deemed necessary.

It is to be noted that the circuit structure of each of above linear adjustment sub-module is merely exemplary, and should not be construed to limit the scope of the present application in any sense. Indeed, taking the advantage of an electrical characteristic of a semiconductor device, each linear adjustment sub-module allows the whole voltage of the adjustment signal COMP to be encompassed within a linear voltage range of a differential amplifier. In some other embodiments, the segment-wise linear adjustment sub-module may include more linear adjustment sub-modules and may convert the voltage of the adjustment signal COMP into currents Imod-i (the suffix i refers to the i-th linear adjustment sub-module) based on more different linear coefficients.

The signal integration sub-module may be coupled to each linear adjustment sub-modules and configured to linearly integrate the electrical signal from these linear adjustment sub-modules into a converted adjustment signal.

The signal integration sub-module may obtain the converted adjustment signal by integrating the currents Imon-i from the linear adjustment sub-modules based on their respective weights. The signal integration sub-module may include resistors Ri, which are coupled to the respective linear adjustment sub-modules and have resistances determined based on their respective weights. In some particular examples, the signal integration sub-module may output the adjustment signal resulting from the integration to the switch-off delay logic sub-module. In some other specific examples, the signal integration sub-module may further include a sampling resistor configured to sample the converted adjustment signal and thereby obtain a voltage signal Vmod representing the converted adjustment signal. The voltage signal Vmod may be output as a reference voltage to the switch-off delay logic sub-module.

The switch-off delay logic sub-module may be configured to receive the control signal for the switching circuit, start a time for counting down the switch-off delay period of the switching circuit based on the control signal and the converted adjustment signal and output the second logic signal for causing the switching circuit to be switched on when the switch-off delay period expires.

The switch-off delay logic sub-module may include a timing circuit component including a capacitor (or a clock signal counter) for producing a voltage Vramp2 indicating the timer value and a comparator for comparing the voltage Vramp2 with the voltage Vmod of the converted adjustment signal. When Vramp2 reaches the voltage Vmod of the converted adjustment signal, the comparator may output the second logic signal.

In order to avoid logic errors, the second logic signal may result from a logic process performed on an electrical signal output from the comparator in the switch-off delay logic sub-module. For example, as shown in FIG. 16, the switch-off delay logic sub-module may receive the control signal for the switching circuit GATE_ON, which may be the same control signal as received by the aforementioned first timer sub-module. The control signal GATE_ON may be configured to control a switch S51. When the switch S51 is switched off, a constant current source may start charging the capacitor C4, and the capacitor C4 may output the voltage Vramp2 that indicates the value of a charge timer. The comparator may compare the voltage Vramp2 with the voltage Vmod. When Vramp2≥Vmod, the comparator may output a high level. In order to prevent the switching circuit in a switched-on state from being mistakenly switched off, the switch-off delay logic sub-module may further include a control logic for the control signal GATE_ON and the voltage signal output from the comparator. The control logic may consist of a NOT gate and an AND gate and configured to output the second logic signal Toff_min both when the control signal GATE_ON dictates to switch off the switching circuit and when the voltage signal from the comparator indicates the expiry of the timer. The second logic signal Toff_min may be also output to the logic control module.

It is to be noted that the circuit structure of the switch-off delay logic sub-module shown in FIG. 16 is merely exemplary and should not be construed to limit the scope of the present application in any sense. Indeed, depending on the switching control logics of the high and low levels of the control signal GATE_ON and on the design of signal voltages received respectively at non-inverting and inverting inputs of the comparator, the second logic signal may also be produced by a control logic consisting of other logic elements or sets of logic elements in the switch-off delay logic sub-module.

It is to be also noted that, depending on the design requirements of the practical application, either or both of the switch-on and switch-off delay logic modules may be arranged in the control circuit. Adjustment accuracy and granularity in the former case will be slightly inferior compared to those in the latter case.

The logic control module may be coupled to the switch-on and switch-off delay logic modules and configured to cause switching-on and-off of the switching circuit based on a control logic of the first and second logic signals. The logic control module may include logic elements or sets of logic elements for enabling the control logic. Examples of the logic elements or sets of logic elements may include, but are not limited to, at least one of AND gates, OR gates, NAND gates, NOT gates, encoders, decoders, selectors, latches, flip-flops and the like, and various combinations thereof.

In some examples, the control signal from the logic control module may cause switching off of the switching circuit when the logic control module receives the first logic signal (or when the first logic signal is active) and cause switching on of the switching circuit when the logic control module receives the second logic signal (or when the second logic signal is active). For example, the logic control module may include a flip-flop having a reset terminal for receiving the first logic signal and a set terminal for receiving a signal resulting from processing of the second logic signal and the demagnetization signal. When the first logic signal is active, the flip-flop may output a low level to cause the switching circuit to be switched off. When the signal resulting from processing of the second logic signal and the demagnetization signal is active, the flip-flop may output a high level to cause the switching circuit to be switched on.

In other examples, the logic control module may be also configured to receive the demagnetization signal from the aforementioned demagnetization detection unit and control switching-on and-off of the switching circuit based on a control logic of the first logic signal, second logic signal and the demagnetization signal. Both the second logic signal and the demagnetization signal may be configured to cause the switching circuit to be switched on. To this end, the logic control module may include a logic element or set of logic elements for detecting switching on of the switching circuit. The logic element or set of logic elements may be configured to cause switching on of the switching circuit based on an active state of the received second logic signal or demagnetization signal, whichever incomes later. For example, the logic control module may be configured with a control logic with the output control signal causing switching on of the switching circuit both when the second logic signal or the demagnetization signal, whichever incomes later, is active and when the first logic signal is inactive, or causing switching off of the switching circuit both when the first logic signal is active and when the second logic signal and the demagnetization signal are both inactive.

It is to be noted that, as will be appreciated by those skilled in the art, the control logic may be practically designed based on the timing and durations of active states of the first logic signal, the second logic signal and the demagnetization signal, without being limited to the circuit structure as described hereinabove.

Figure 23:
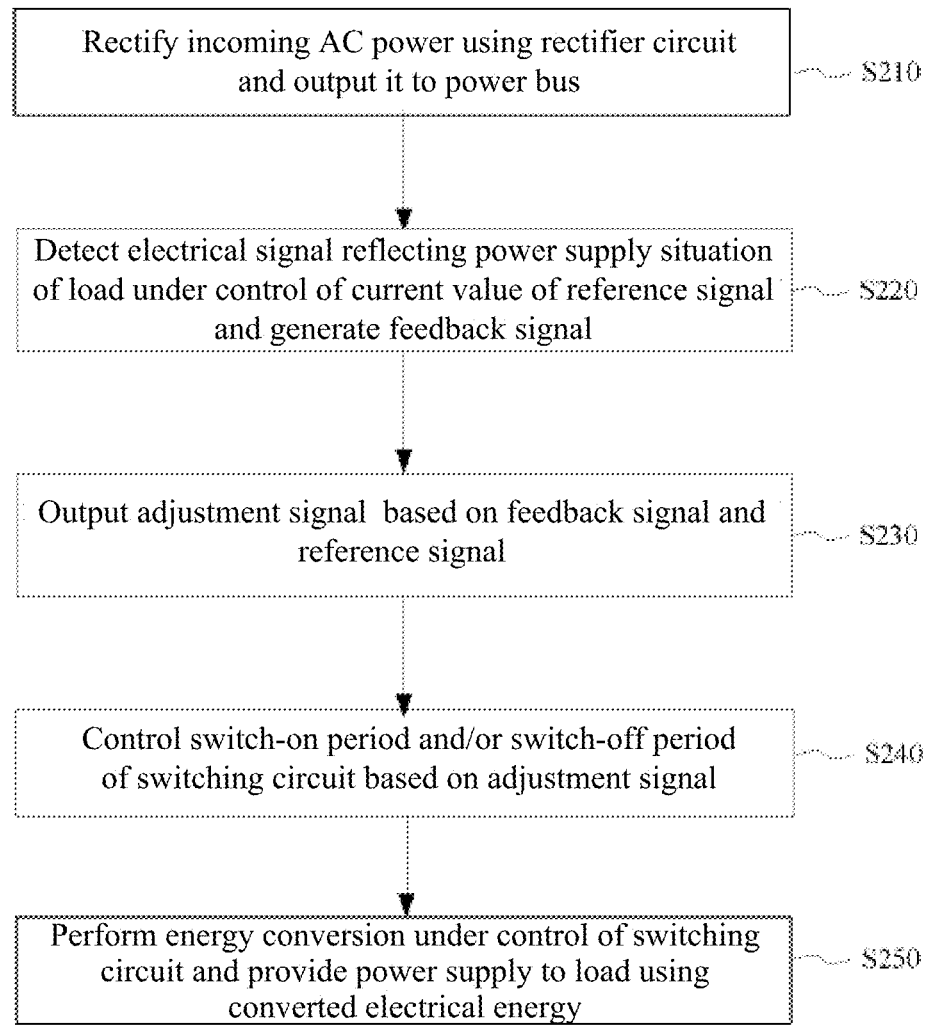
FIG. 23 shows a flowchart of a driving method according to an embodiment of the present application.

Reference is now made to FIG. 23, a flowchart of a driving method according to an embodiment of the present application. The driving method can be implemented principally by the driving system as defined above. Alternatively, it may also be implemented by any other driving system suitable for implementing the method.

In step S210, incoming AC power is rectified and output to a power bus.

The incoming AC power may be rectified and output to the power bus by a rectifier circuit. As shown in FIG. 16, the rectifier circuit 41 may include a diode bridge rectifier and a capacitor, which are configured to rectify the AC power into half-sine power supply waves and output the waves to the power bus. A switching circuit for a line circuit (i.e., a line for provide a power supply to a load) connected to the power bus may be switched on and off under the control of a chip incorporating the control circuit. The control circuit may be configured to carry out the following steps S220 to S240.

In step S220, an electrical signal reflecting a power supply situation of the load under the control of a current value of a reference signal is detected, and feedback signal is generated.

In step S230, an adjustment signal conveying adjustment metric information indicated in the reference signal is output based on the feedback signal and the reference signal.

In step S240, a switch-on period and/or a switch-off period of the switching circuit is/are controlled based on the adjustment signal.

It is to be noted that steps S220 to S240 correspond to the above-described steps S110 to S130, so a repeated description of them can be dispensed with. The control circuit accomplishes switching on and off of the line circuit through causing switching on and off of the switching circuit.

In step S250, energy conversion is performed under the control of the switching circuit, and a power supply is provided to the load using the converted electrical energy.

The line circuit may be arranged on the load side and coupled to the power bus, and a power conversion circuit may be arranged in the line circuit. The power conversion circuit may be configured to convert the rectified power into DC power by means of switching-on and-off of the switching circuit, and the converted electrical energy may be supplied to the load. The power conversion circuit may include, for example, an LC power conversion circuit.

In some embodiments, the reference signal may result from conversion of an adjustment control command generated from an operation performed by a user. To this end, in such embodiments, the driving system may further include a main control circuit.

Reference is now made to FIG. 21, a structural schematic of the driving system according to an embodiment. As shown, the main control circuit 46 may include at least a data interface unit 462 and a processing unit 461. The data interface unit 462 may include, but is not limited to, a wireless network interface module, a data line interface module, etc. The wireless network interface module may be implemented as, for example, a radio frequency (RF)-based network interface module, a ZigBee-based network interface module, a WiFi-based network interface module, a mobile communication-based network interface module or the like. The data line interface module may be implemented as, for example, a USB-based interface module, an RS-232-based interface module or the like. The processing unit 461 may be connected to both of the wireless network interface module and the data line interface module and configured to convert the adjustment control command acquired by the wireless network interface module into the reference signal and output the reference signal to the control circuit via the data line interface module. For example, the main control circuit 46 may be communicatively coupled to the user's mobile device through the wireless network interface module and acquire the adjustment control command resulting from an operation performed by the user on the mobile device, and the processing unit 461 may convert the adjustment control command into the reference signal, which duty cycle contains adjustment metric information. In other examples, the main control circuit 46 may include a human-machine interaction interface (not shown) connected to the processing unit 461 via the data interface unit 462, and the user may manipulate the human-machine interaction interface to result in the adjustment control command. Examples of the human-machine interaction interface may include touch panels, buttons, scroll wheels and the like.

For some LED lights, the main control circuit in the driving system may be disposed in the human-machine interaction interface that is embedded in a wall. In such scenarios, a switch in the human-machine interaction interface may be wired to the rectifier circuit so as to form an AC power supply circuit, and the main controller may be wired to a chip in order to enable the transmission of a PWM signal. The user may issue the adjustment control command to the main control circuit by manipulating option buttons on the human-machine interaction interface, and the processing unit in the main control circuit may convert the adjustment control command into the PWM signal, which may be then output via the data interface unit to the control circuit in the chip. The control circuit may responsively adjust brightness of the LED light in accordance with any of the foregoing embodiments, which have been described above and will therefore not be described once again.

For some other LED lights, the main control circuit in the driving system may be arranged on a printed circuit board (PCB) together with the rectifier circuit, the switching circuit, the power conversion circuit, a chip and related peripheral circuitry. In such scenarios, the use may manipulate an intelligent terminal device to communicate the adjustment control command to the main control circuit, and the processing unit in the main control circuit may convert the adjustment control command into the PWM signal, which may be then output via the data interface unit to the control circuit in the chip. The control circuit may responsively adjust brightness of the LED light in accordance with any of the foregoing embodiments, which have been described above and will therefore not be described once again.

In summary, in the provided control circuit and method, driving system and method and chip, by determining adjustment metric information for a current value of the current reference signal through detecting an electrical signal from the switching circuit, the control circuit and the driving system can be adapted to the specifications of any AC power standard. Moreover, through controlling the switch-on and switch-off periods of the switching circuit by means of the adjustment metric information, much more granular adjustments can be made in power supplied to the load.

The embodiments disclosed hereinabove are solely for the purpose of exemplary illustration of the principles and benefits of the present application and not for the purpose of limiting the application. Any person familiar with the art can make modifications or changes to the disclosed embodiments without departing from the spirit and scope of this application. Accordingly, any and all equivalent modifications or changes made by any person with general common knowledge in the art without departing from the spirit and teachings of the present application are intended to be embraced within the scope as defined by the appended claims.

What is claimed is:

1. A control circuit for controlling a switching circuit connected to a load based on an input signal, the input signal being a PWM signal with a duty cycle, the control circuit configured to control the switching circuit on and off based on the duty cycle for adjusting power supplied to the load accordingly, the control circuit comprising:
   an adjustment signal generation unit configured to receive a predefined voltage and the input signal, process the predefined voltage based on the input signal, generate a square-wave reference signal reflecting the duty cycle, obtain a feedback signal reflecting the power supplied to the load, and generate an adjustment signal based on both the square-wave reference signal and the feedback signal; and
   a control unit coupled to the adjustment signal generation unit, configured to generate a control signal for controlling the switching circuit on and off based on the adjustment signal,
   wherein the adjustment signal generation unit comprises a feedback module configured to acquire a sampled electrical signal from the switching circuit and the control signal for generating the feedback signal, the feedback signal reflecting the power supplied to the load within a single operating cycle of the switching circuit, wherein the feedback module comprises a second logic processing sub-module and a second signal processing sub-module coupled to the second logic processing sub-module, the second logic processing sub-module configured to control the second signal processing sub-module based on a set of control logics corresponding to multiple time periods within the single operating cycle.

2. The control circuit according to claim 1, wherein the adjustment signal generation unit comprises a square-wave reference signal generation module, and the square-wave reference signal generation module comprising:
   a chopper configured to receive the input signal and a predefined voltage, and output the square-wave reference signal by chopping the predefined voltage according to the duty cycle.

3. The control circuit according to claim 1, wherein the feedback module generates a detecting signal as the feedback signal according to a peak voltage of the sampled electrical signal acquired during an on time of the switching circuit, and wherein the detecting signal reflects an average voltage of the sampled electrical signal within a single operating cycle.

4. The control circuit according to claim 3, wherein the feedback module comprises a sample and hold capacitor, a first switch, a second switch, a proportional amplifier having an operational amplifier and two resistors, wherein during the on time indicated by the control signal, the sample electrical signal charges the sample and hold capacitor through the first switch being on and the second switch being off, wherein during an off time of the switching circuit indicated by the control signal, a voltage across the sample and hold capacitor maintains at the peak voltage of the sample electrical signal within the single operating cycle through the first switch being off and the second switching being on, the voltage across the sample and hold capacitor received and divided by the proportional amplifier, configured to generates the detecting signal at an output of the proportional amplifier, the detecting signal reflecting the an average voltage of the sampled electrical signal in the single operating cycle.

5. The control circuit according to claim 1, wherein the feedback module is configured to receive a demagnetization signal of a power conversion circuit connected to the switching circuit, wherein
the set of control logics based on the control signal of the switching circuit and the demagnetization signal; and
wherein the second signal processing sub-module is configured to:
output the sampled electrical signal as the feedback signal during the on time indicated by the control signal;
output an amplified and buffered sample electrical signal as the feedback signal during a demagnetization period indicated by the demagnetization signal; and
output a voltage ground as the feedback signal when the power supplied to the load is zero.

6. The control circuit according to claim 5, the second signal processing sub-module comprising a sample and hold capacitor, a proportional amplifier having an operational amplifier and two resistors, a buffer, the second logic processing sub-module comprising a first switch, a second switch, a third switch, a fourth switch and an NOR gate,
wherein during the on time indicated by the control signal, the control signal turns on the first switch to allow the sampled electrical signal charge the sample and hold capacitor, and the proportional amplifier divides a voltage across the sample and hold capacitor to the buffer, and the control signal turns the third switch on to output the sampled electrical signal as the feedback signal;
wherein during the demagnetization period indicated by the demagnetization signal, the control signal turns the first switch and the third switch off, and the demagnetization signal turns the second switch on, and a signal output from the buffer serves as the feedback signal; and
wherein when the power supplied to the load is zero, input terminals of the NOR gate receive the control signal and the demagnetization signal, and an output signal of the NOR gate turns the fourth switch on to output a ground voltage as the feedback signal, and the first switch, the second switch, and the third switch are all off.

7. The control circuit according to claim 1, wherein the feedback module is configured to receive a demagnetization signal of a power conversion circuit connected to the switching circuit, wherein the feedback module comprises a third logic processing sub-module and a third signal processing sub-module coupled to the third logic processing sub-module, and wherein:

the third logic processing sub-module is configured to generate a period logic signal based on the demagnetization signal and the control signal of the switching circuit;
the third logic processing sub-module is configured to control the third signal processing sub-module based on a set of control logics corresponding to multiple time periods within the single operating cycle, the set of control logics based on the control signal of the switching circuit and the period logic signal;
the third signal processing sub-module is configured to output an amplified and buffered sampled electrical signal as the feedback signal during the on time indicated by the control signal and the demagnetization period indicated by the demagnetization signal, and output a voltage ground as the feedback signal when the power supplied to the load is zero.

8. The control circuit according to claim 7, wherein the third signal processing sub-module comprises a capacitor, two amplifiers and two resistors; and the third logic processing sub-module comprises four switches.

9. The control circuit according to claim 1, wherein the adjustment signal generation unit further comprises a loop compensation module, the loop compensation module received the square-wave reference signal and the feedback signal, the loop compensation module configured to perform a low-pass filtering process on an error signal derived from the square-wave reference signal and the feedback signal, and output the adjustment signal.

10. The control circuit according to claim 9, wherein the loop compensation module comprises:
a transconductance amplifier configured to output differential-integral signals derived from the feedback signal and the reference signal; and
a filtering capacitor coupled to the transconductance amplifier, the filtering capacitor configured to low-pass filter the differential-integral signals and output the adjustment signal.

11. The control circuit according to claim 1, wherein the control unit comprises:
a switching logic module coupled to the adjustment signal generation unit, the switching logic module configured to count down an on time and/or an off time of the switching circuit, based on the adjustment signal and the control signal, and output a logic signal for controlling off and/or on of the switching circuit upon an expiration of a threshold period decided by the adjustment signal; and
a logic control module coupled to the switching logic module, the logic control module configured to control off and/or on of the switching circuit based on a control logic of the logic signal for controlling off and/or on of the switching circuit.

12. The control circuit according to claim 11, wherein the switching logic module comprises a switch-on logic module coupled to the adjustment signal generation unit, the switch-on logic module configured to adjust the on time of the switching circuit based on the adjustment signal and output a first logic signal for causing the switching circuit to be switched off upon expiration of a first threshold period decided by the adjustment signal; wherein the switch-on logic module comprises:
a first timer sub-module configured to acquire the control signal for the switching circuit, start a timer for counting down the on time of the switching circuit when the control signal dictates to switch on the switching circuit, and output timing information indicative of the on time of the switching circuit; and a first logic sub-module coupled to the first timer sub-module, the first logic sub-module configured to output the first logic signal when the timing information is matched with adjustment metric information.

13. The control circuit according to claim 11, wherein the switching logic module comprises a switch-off delay logic module coupled to the adjustment signal generation unit, the switch-off delay logic module configured to adjust a switch-off delay period of the switching circuit based on the adjustment signal and output a second logic signal for enabling the switching circuit being turned on upon an expiration of a second threshold period decided by the adjustment signal; wherein the switch-off delay logic module comprises:

a segment-wise linear adjustment sub-module with at least two different linear segments, the segment-wise linear adjustment sub-module configured to convert the adjustment signal based on adjustment metric information indicated in the adjustment signal and a corresponding one of the linear segments; and a switch-off delay logic sub-module coupled to the segment-wise linear adjustment sub-module, the switch-off delay logic sub-module configured to acquire the control signal for the switching circuit, start the timer for counting down the off time of the switching circuit based on the control signal and the converted adjustment signal, and output the second logic signal upon the expiration of a second threshold period decided by the adjustment signal.

14. The control circuit according to claim 13, wherein the segment-wise linear adjustment sub-module comprises: at least two linear adjustment sub-modules with different linear profiles, each of the linear adjustment sub-modules configure to convert the adjustment signal based on its own linear profile; and a signal integration sub-module coupled to each of the linear adjustment sub-modules, the signal integration sub-module configured to produce the converted adjustment signal by linearly integrating electrical signals output from the respective linear adjustment sub-modules.

15. The control circuit according to claim 11, wherein the logic control module is further configured to receive a demagnetization signal of a power conversion circuit connected to the switching circuit, and the logic control module configured to control on and off of the switching circuit based on a control logic of the logic signal and the demagnetization signal.

16. A chip, comprising a control circuit for controlling a switching circuit connected to a load based on an input signal, the input signal being a PWM signal with a duty cycle, and the control circuit configured to control an on time and/or an off time of the switching circuit based on the duty cycle for adjusting power supplied to the load, the control circuit comprising:

an adjustment signal generation unit configured to receive a predefined voltage and the input signal, process the predefined voltage based on the input signal, generate a square-wave reference signal reflecting the duty cycle, obtain a feedback signal reflecting the power supplied to the load, and generate and output an adjustment signal based on both the reference signal and the feedback signal; and a control unit coupled to the adjustment signal generation unit, the control unit configured to generate a control signal for controlling the on time and/or the off time of the switching circuit based on the adjustment signal, wherein the adjustment signal generation unit comprises a feedback module configured to acquire a sampled electrical signal from the switching circuit and the control signal for generating the feedback signal, the feedback signal reflecting the power supplied to the load within a single operating cycle of the switching circuit, wherein the feedback module comprises a second logic processing sub-module and a second signal processing sub-module coupled to the second logic processing sub-module, the second logic processing sub-module configured to control the second signal processing sub-module based on a set of control logics corresponding to multiple time periods within the single operating cycle.

17. The chip according to claim 16, wherein the adjustment signal generation unit comprises:

a feedback module configured to acquire an electrical signal sampled from the switching circuit and the control signal for generating the feedback signal, wherein the feedback signal reflects the power supplied to the load within a single operating cycle of the switching circuit;

a loop compensation module, the loop compensation module coupled to the reference signal generation module to obtain the reference signal and coupled to the feedback module to obtain the feedback signal, the loop compensation module configured to perform a low-pass filtering process on an error signal derived from the reference signal and the feedback signal, and output the adjustment signal.

18. The chip according to claim 17, further comprising a filtering capacitor pin, wherein the loop compensation module comprises: a transconductance amplifier configured to output differential-integral signals derived from the feedback signal and the reference signal; and a filtering capacitor coupled to the transconductance amplifier, the filtering capacitor configured to low-pass filter the differential-integral signals and output the adjustment signal, wherein the transconductance amplifier has an output, which is connected to an external filtering capacitor via the filtering capacitor pin in order to obtain the adjustment signal.

19. The chip according to claim 16, further comprising a driving element coupled to the control circuit, the driving element configured to drive the switching element arranged in a power supply line for the load under a control of the control circuit.

* * * * *